(12) United States Patent
Sugawa et al.

(10) Patent No.: US 10,720,467 B2
(45) Date of Patent: Jul. 21, 2020

(54) OPTICAL SENSOR AND SIGNAL READOUT METHOD THEREFOR, AND SOLID-STATE IMAGE PICKUP DEVICE AND SIGNAL READOUT METHOD THEREFOR

(71) Applicant: TOHOKU UNIVERSITY, Miyagi (JP)

(72) Inventors: Shigetoshi Sugawa, Miyagi (JP); Rihito Kuroda, Miyagi (JP); Shunichi Wakashima, Miyagi (JP)

(73) Assignee: Tohoku University, Miyagi (JP)

( * ) Notice: Subject to any disclaimer, the term of this patent is extended or adjusted under 35 U.S.C. 154(b) by 0 days.

(21) Appl. No.: 16/339,438

(22) PCT Filed: Oct. 7, 2016

(86) PCT No.: PCT/JP2016/080025
§ 371 (c)(1),
(2) Date: Apr. 4, 2019

(87) PCT Pub. No.: WO2018/066143
PCT Pub. Date: Apr. 12, 2018

(65) Prior Publication Data
US 2020/0043971 A1 Feb. 6, 2020

(51) Int. Cl.
*H04N 5/335* (2011.01)
*H01L 27/146* (2006.01)
(Continued)

(52) U.S. Cl.
CPC .... *H01L 27/14643* (2013.01); *H01L 29/7833* (2013.01); *H04N 5/378* (2013.01); *H04N 5/37455* (2013.01); *H04N 5/37457* (2013.01)

(58) Field of Classification Search
CPC .......... H01L 27/14643; H01L 29/7833; H04N 5/37455
(Continued)

(56) References Cited

U.S. PATENT DOCUMENTS

2007/0131991 A1 6/2007 Sugawa
2008/0266434 A1 10/2008 Sugawa et al.
(Continued)

FOREIGN PATENT DOCUMENTS

JP 2005-328493 A 11/2005
JP 2008-016723 A 1/2008
(Continued)

OTHER PUBLICATIONS

International Search Report issued in corresponding International Application No. PCT/JP2016/080025.

*Primary Examiner* — Usman A Khan
(74) *Attorney, Agent, or Firm* — Morgan, Lewis & Bockius LLP

(57) ABSTRACT

One of the problems addressed by the present invention is to provide an optical sensor, a solid-state imaging device, and a signal readout method therefor that greatly contribute to a further development of industry and to the realization of a more secure and safe society. One of the solutions provided by the present invention is an optical sensor comprising a light reception element, a storage capacitor for storing charges, and a transfer switch for transferring, to the storage capacitor, a charge generated by light input into the light reception element. The storage capacitor includes a floating diffusion capacitor and a lateral overflow integration capacitor. The transfer switch is an LDD-MOS transistor of which a drain area has a specific impurity concentration.

6 Claims, 20 Drawing Sheets

(51) Int. Cl.
*H01L 29/78* (2006.01)
*H04N 5/3745* (2011.01)
*H04N 5/378* (2011.01)

(58) Field of Classification Search
USPC .......................................................... 348/308
See application file for complete search history.

(56) References Cited

U.S. PATENT DOCUMENTS

2009/0289282 A1   11/2009  Tsuno
2017/0324916 A1*  11/2017  Sugawa ............... H04N 5/3745

FOREIGN PATENT DOCUMENTS

| | | |
|---|---|---|
| JP | 2009-283649 A | 12/2009 |
| WO | 2005/083790 A1 | 9/2005 |
| WO | 2016/080337 A1 | 5/2016 |

\* cited by examiner

OPTICAL SENSOR AND SIGNAL READOUT METHOD THEREFOR, AND SOLID-STATE IMAGE PICKUP DEVICE AND SIGNAL READOUT METHOD THEREFOR

TECHNICAL FIELD

This invention relates to an optical sensor and a signal readout method therefor, and a solid-state image pickup device and a signal readout method therefor.

BACKGROUND ART

Demands for an optical sensor and a solid-state image pickup device are drastically increasing along with development of science and technology and diffusion of the internet society. At the same time, the market has a high demand for, as an indispensable item to create a new market, an optical sensor and a solid-state image pickup device capable of picking up a still image and a moving image, which have a high sensitivity, a high speed capability, a broad dynamic range, and a broad light wavelength band. In particular, an optical sensor and solid-state image pickup device having a broader dynamic range are demanded in, for example, medical, pharmaceutical, health, and nursing markets, a life science market, and a disaster prevention and crime prevention market indispensable for establishing a safe and secure society.

Examples of the optical sensor and solid-state image pickup device having a broad dynamic range are described in, for example, Patent Document 1.

However, although the optical sensor and solid-state image pickup device described in Patent Document 1 definitely have a broader dynamic range than those of related-art devices, the broadened region of the dynamic range only relates to high illuminance, and the region of the dynamic range remains to be the same as those of the related-art devices for low illuminance. As a result, the optical sensor and solid-state image pickup device described in Patent Document 1 do not satisfy the demand of a market that sometimes requires a broader dynamic range also in a low-light amount region. Thus, satisfaction of such a demand is still a critical problem for the international society to further develop the industry and realize a safer and securer society.

The inventors of this invention have already presented an optical sensor and solid-state image pickup device for solving this problem (Patent Document 2).

PRIOR ART DOCUMENT(S)

Patent Document(s)

Patent Document 1: JP 2005-328493 A
Patent Document 2: WO 2016/080337 A1

SUMMARY OF THE INVENTION

Problem to be Solved by the Invention

However, the optical sensor and the solid-state image pickup device (hereinafter sometimes referred to as "optical device" when any one or both of the optical sensor and the solid-state image pickup device are specified) described in Patent Document 2 each include a transistor having a lightly doped drain (LDD) structure and a transistor having a non-LDD structure (transistor that does not have an LDD structure) in a mixed manner. Thus, in the later repeated process of examination, design, and implementation of a mass production process in an inductive manner, it has been found that there is a potential problem of leading to a higher production cost because a larger number of processing steps is required for the mass production process for the optical device and the mass production process itself is likely to be complicated. Further, it has been found that this problem may further cause a problem in that securing of uniformity and stability of a light sensing characteristic among pixels becomes more difficult as the number of effective pixels becomes larger and as the pixel density becomes higher.

Herein, the term "LDD" may be used not only for a drain (electrode) region but also for a source (electrode) region because the source (electrode) region and the drain (electrode) region are symmetric due to the structure of a MOS transistor. This is common in the semiconductor industry.

This invention has been made as a result of conducting intensive research and development in view of the above, and has a primary object to provide an optical sensor and a solid-state image pickup device, which can be mass-produced without leading to a higher production cost than that of a general mass-production process and greatly contribute to further development of the industry and realization of a safer and securer society, and to provide signal readout methods therefor.

This invention has another object to provide an optical sensor and a solid-state image pickup device, which can be mass-produced similarly to a general mass-production process and have a broader dynamic range capable of detecting one photon, and to provide signal readout methods therefor.

This invention has still another object to provide an optical sensor and a solid-state image pickup device, which can be mass-produced by a general mass-production process and have a dynamic range of from a one-photon light region to a high-illuminance light region, a high sensitivity, a high speed capability, and a broad light wavelength band, and to provide signal readout methods therefor.

This invention has yet another object to provide an optical sensor and a solid-state image pickup device, which can be mass-produced by a general mass-production process and have a broad dynamic range satisfying both of a high-sensitivity performance capable of detecting one photon and a sufficiently high saturation performance, a high sensitivity, a high speed capability, and a broad light wavelength band, and to provide signal readout methods therefor.

In order to achieve the above-mentioned objects, an optical sensor that uses a MOS ransistor having an LDD structure, instead of a MOS transistor having a non-LDD structure for a transfer switch included in the optical sensor described in Patent Document 2, has been repeatedly designed, prototyped, inspected in terms of characteristic and performance, and examined in an inductive manner. This invention is based on the finding that an optical sensor having sensor performance at least equivalent to that of the optical sensor described in Patent Document 2 can be mass-produced without leading to a higher production cost than that of a general mass-production process when the optical sensor adopts a specific structure, size, and amount of semiconductor impurity as will later be described.

An aspect of this invention is specified by an optical sensor, comprising:
a light receiving element;
a storage capacitor configured to store a charge;
a transfer switch configured to transfer, to the storage capacitor, a charge generated by light input to the light receiving element; and
a pixel signal output line,
wherein the pixel signal output line has a signal readout path connected thereto,
wherein the storage capacitor includes a floating diffusion capacitor ($C_{FD}$) and a lateral overflow integration capacitor ($C_{LOFIC}$),
wherein the transfer switch includes an LDD-MOS transistor,
wherein a concentration ($N_D$) of semiconductor impurities in a drain region of the LDD-MOS transistor and a concentration (N) of semiconductor impurities in a diffusion region provided adjacent to the drain region satisfy the following relationships:

$$1 < N/N_D \leq 100 \quad (1); \text{ and}$$

$$0 < N \leq 1.0 \times 10^{20} \text{ cm}^{-3} \quad (2),$$

wherein a first pixel output signal subjected to charge-to-voltage conversion by the floating diffusion capacitor ($C_{FD}$) and a second pixel output signal subjected to charge-to-voltage conversion by a combination of the floating diffusion capacitor ($C_{FD}$) and the lateral overflow integration capacitor ($C_{LOFIC}$) are input to the signal readout path, and
wherein the first pixel output signal is amplified by an amplification factor larger than 1 when the first pixel output signal is an ultra-high sensitive signal.

Another aspect of this invention is specified by a multi-pixel optical sensor, comprising:
a row of plurality of two-dimensionally arranged pixel units, each including:
a light receiving element;
a storage capacitor configured to store a charge; and
a transfer switch configured to transfer, to the storage capacitor, a charge generated by light input to the light receiving element,
the storage capacitor including a floating diffusion capacitor ($C_{FD}$) and a lateral overflow integration capacitor ($C_{LOFIC}$),
the transfer switch including an LDD-MOS transistor,
a concentration ($N_D$) of semiconductor impurities in a drain region of the LDD-MOS transistor and a concentration (N) of semiconductor impurities in a diffusion region provided adjacent to the drain region satisfying the following relationships:

$$1 < N/N_D \leq 100 \quad (1); \text{ and}$$

$$0 < N \leq 1.0 \times 10^{20} \text{ cm}^{-3} \quad (2),$$

a pixel signal output line, to which each of the plurality of two-dimensionally arranged pixel units is sequentially connected; and
a signal readout path unit configured to execute amplification by using an amplification factor larger than 1 and another amplification factor different from the amplification factor in a different manner, the signal readout path unit being connected to the pixel signal output line at a position downstream of a position at which a last pixel unit in the row of plurality of two-dimensionally arranged pixel units is connected to the pixel signal output line,
wherein a first pixel output signal subjected to charge-to-voltage conversion by the floating diffusion capacitor ($C_{FD}$) and a second pixel output signal subjected to charge-to-voltage conversion by a combination of the floating diffusion capacitor ($C_{FD}$) and the lateral overflow integration capacitor ($C_{LOFIC}$) are input to the signal readout path.

A yet another aspect of this invention is specified by a signal readout method to be executed by an optical sensor, the optical sensor including, for each pixel unit:
a light receiving element;
a storage capacitor configured to store a charge; and
a transfer switch configured to transfer, to the storage capacitor, a charge generated by light input to the light receiving element,
the storage capacitor including a floating diffusion capacitor and a lateral overflow integration capacitor,
the transfer switch including an LDD-MOS transistor,
a concentration ($N_D$) of semiconductor impurities in a drain region of the LDD-MOS transistor and a concentration (N) of semiconductor impurities in a diffusion region provided adjacent to the drain region satisfying the following relationships:

$$1 < N/N_D \leq 100 \quad (1); \text{ and}$$

$$0 < N \leq 1.0 \times 10^{20} \text{ cm}^{-3} \quad (2),$$

the optical sensor further including:
a pixel signal output line, to which each pixel unit is connected; and
a signal readout path connected to the pixel signal output line,
the signal readout method comprising:
subjecting, by the floating diffusion capacitor, an amount of charges that contribute to readout to charge-to-voltage conversion so as to form a first pixel output signal;
subjecting, by a combination of the floating diffusion capacitor and the lateral overflow integration capacitor, the amount of charges that contribute to readout to charge-to-voltage conversion so as to form a second pixel output signal;
inputting the first pixel output signal and the second pixel output signal to the signal readout path; and
amplifying the first pixel output signal in the signal readout path by a plurality of amplifiers including at least one amplifier having an amplification factor larger than 1.

Another aspect of this invention is specified by an image pickup device, comprising:
a plurality of pixel units each including:
a light receiving element (PD);
a switch for transfer (T);
a switch for overflow (S);
a switch for resetting (R);
the light receiving element (PD), the switch for transfer (T), the switch for overflow (S), and the switch for resetting (R) are connected in series in the stated order,
a floating diffusion capacitor ($C_{FD}$) and a source-follower switch (SF), which are connected to a line between the switch for transfer (T) and the switch for overflow (S); and
a lateral overflow integration capacitor ($C_{LOFIC}$), which is connected to a line between the switch for overflow (S) and the switch for resetting (R),
the source-follower switch (SF) including a MOS transistor,
a concentration ($N_D$) of semiconductor impurities in a drain region in the switch for transfer (T) and a concentration (N) of semiconductor impurities in a diffusion region provided adjacent to the drain region satisfying the following relationships:

$$1 < N/N_D \leq 100 \qquad (1); \text{ and}$$

$$0 < N \leq 1.0 \times 10^{20} \text{ cm}^{-3} \qquad (2),$$

the light receiving elements (PD) of the plurality of pixel units forming an array of two-dimensionally arranged pixels;

a pixel row output signal line, to which the plurality of pixel units are sequentially connected; and a reading unit connected to the pixel row output signal line, wherein a first pixel output signal subjected to charge-to-voltage conversion by the floating diffusion capacitor ($C_{FD}$) and a second pixel output signal subjected to charge-to-voltage conversion by a combination of the floating diffusion capacitor ($C_{FD}$) and the lateral overflow integration capacitor ($C_{LOFIC}$) are input to the reading unit, and wherein the first pixel output signal is amplified in a signal readout path by a plurality of amplifiers including at least one amplifier having an amplification factor larger than 1.

A further aspect of this invention is specified by a signal readout method for an image pickup device, the signal readout method comprising:

preparing an image pickup device including:
a plurality of pixel units each including:
a light receiving element (PD);
a switch for transfer (T);
a switch for overflow (S);
a switch for resetting (R);
the light receiving element (PD), the switch for transfer (T), the switch for overflow (S), and the switch for resetting (R) are connected in series in the stated order,
a floating diffusion capacitor ($C_{FD}$) and a source-follower switch (SF), which are connected to a line between the switch for transfer (T) and the switch for overflow (S); and
a lateral overflow integration capacitor ($C_{LOFIC}$), which is connected to a line between the switch for overflow (S) and the switch for resetting (R),
the source-follower switch (SF) including a MOS transistor,
a concentration ($N_D$) of semiconductor impurities in a drain region in the switch for transfer (T) and a concentration (N) of semiconductor impurities in a diffusion region provided adjacent to the drain region satisfying the following relationships:

$$1 < N/N_D \leq 100 \qquad (1); \text{ and}$$

$$0 < N \leq 1.0 \times 10^{20} \text{ cm}^{-3} \qquad (2),$$

the light receiving elements (PD) of the plurality of pixel units forming an array of two-dimensionally arranged pixels;

a pixel row output signal line, to which the plurality of pixel units are sequentially connected; and a reading unit connected to the pixel row output signal line;

subjecting, by the floating diffusion capacitor ($C_{FD}$), an amount of charges that contribute to readout to charge-to-voltage conversion so as to form a first pixel output signal;

subjecting, by a combination of the floating diffusion capacitor ($C_{FD}$) and the lateral overflow integration capacitor ($C_{LOFIC}$), the amount of charges that contribute to readout to charge-to-voltage conversion so as to form a second pixel output signal;

inputting the first pixel output signal and the second pixel output signal to a signal readout path; and amplifying the first pixel output signal in the signal readout path by a plurality of amplifiers including at least one amplifier having an amplification factor larger than 1.

A yet further aspect of this invention is specified by an optical sensor, comprising:

(1) a pixel unit having a photoelectric conversion function,
the pixel unit including:
a storage capacitor configured to store a charge subjected to photoelectric conversion; and
a transfer switch configured to transfer the charge to the storage capacitor;
the storage capacitor including a floating diffusion capacitor ($C_{FD}$) and a lateral overflow integration capacitor ($C_{LOFIC}$),
the transfer switch including an LDD-MOS transistor,
a concentration ($N_D$) of semiconductor impurities in a drain region of the LDD-MOS transistor and a concentration (N) of semiconductor impurities in a diffusion region provided adjacent to the drain region satisfying the following relationships:

$$1 < N/N_D \leq 100 \qquad (1); \text{ and}$$

$$0 < N \leq 1.0 \times 10^{20} \text{ cm}^{-3} \qquad (2),$$

(2) a pixel signal output line connected to the pixel unit; and (3) a signal readout path connected to the pixel signal output line, wherein a first pixel output signal subjected to charge-to-voltage conversion by the floating diffusion capacitor ($C_{FD}$) and a second pixel output signal subjected to charge-to-voltage conversion by a combination of the floating diffusion capacitor ($C_{FD}$) and the lateral overflow integration capacitor ($C_{LOFIC}$) are input to the signal readout path, and wherein the first pixel output signal is amplified by an amplification factor larger than 1 when the first pixel output signal is an ultra-high sensitive signal.

Effect of the Invention

According to the embodiments of this invention, it is possible to provide the optical sensor and the solid-state image pickup device, which can be mass-produced without leading to a higher production cost than that of a general mass-production process and have a dynamic range of from a one-photon light region to a high-illuminance light region, a high sensitivity, a high speed capability, and a broad light wavelength band, and to provide drive methods therefor. Thus, it is possible to greatly contribute to further development of the industry and realization of a safer and securer society.

MODES FOR EMBODYING THE INVENTION

Figure 1:
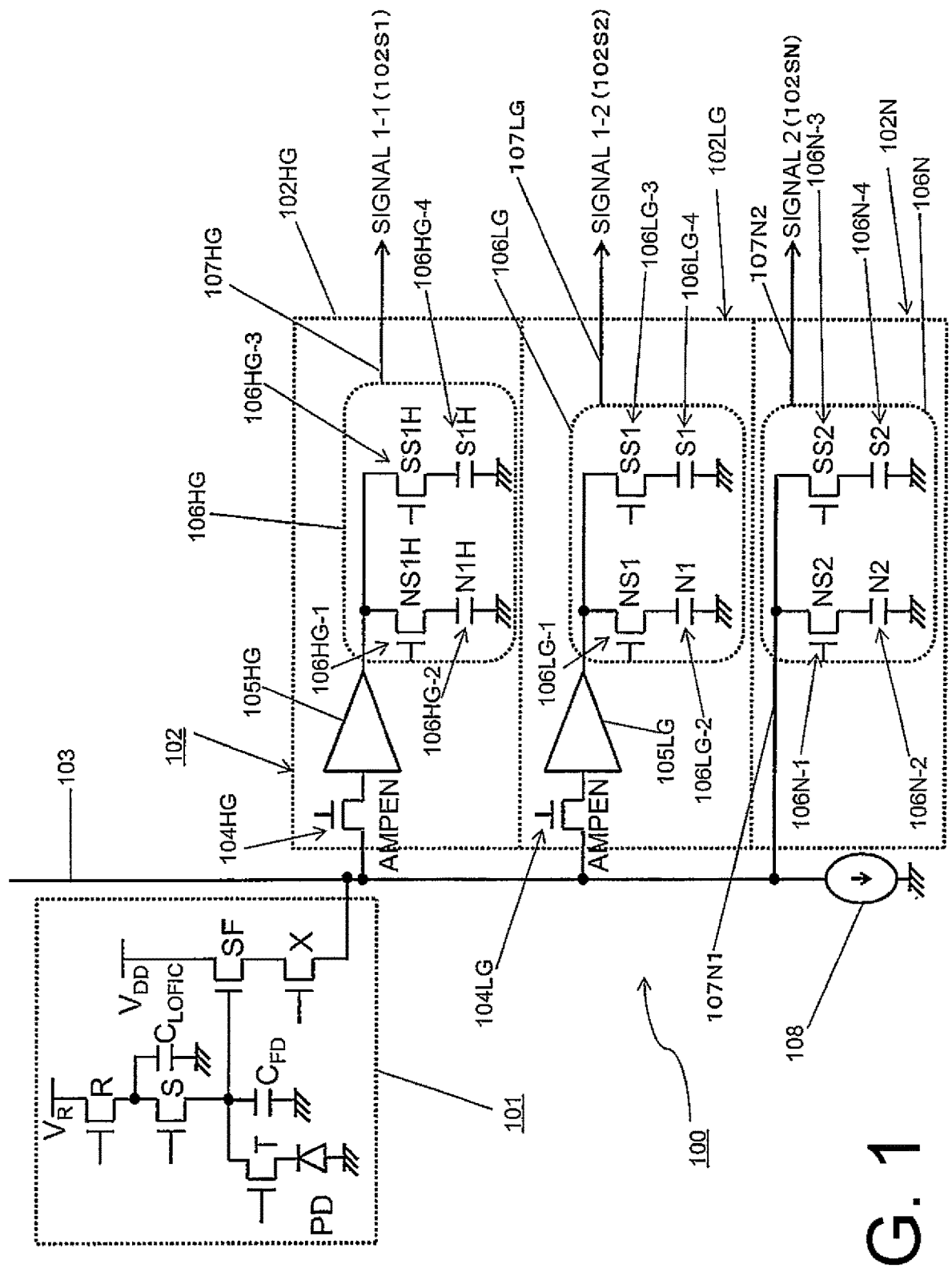
FIG. 1 is a circuit diagram for illustrating an example of a pixel circuit and one row of readout circuits of a CMOS image sensor in a preferred embodiment of this invention.

FIG. 1 is a circuit diagram for illustrating an example of a pixel circuit and one row of readout circuits of a CMOS image sensor in a preferred embodiment (first embodiment) of this invention.

By using the circuit configuration of FIG. 1 and device structure described later, it is possible to achieve both of a high sensitivity and high saturation in photon detection.

In FIG. 1, essential components are illustrated to avoid the diagram and description from being complicated, and to facilitate clear understanding of features of this invention with the briefest description.

An optical sensor unit 100 of FIG. 1 includes a pixel unit 101 and a readout unit 102.

The pixel unit 101 and the readout unit 102 are electrically connected to each other via a pixel row output signal line 103. A current source 108 is provided downstream of the pixel row output signal line 103. The current source 108 includes, for example, a MOS transistor.

The equivalent circuit diagram of the pixel unit 101 is similar to a pixel equivalent circuit diagram of FIG. 21 of Patent Document 1. In the example of FIG. 1, the readout unit or row circuit unit 102 includes three row readout units (102HG, 102LG, and 102N).

In the first row readout unit 102HG for outputting a signal 1-1 102S1, switching means (SW/AMPEN) 104HG for reading out the signal 1-1 102S1, a high gain amplifier 105HG, and an analog memory circuit unit 106HG are arranged from the upstream side in the stated order, and are electrically connected to a signal line 107HG.

In the analog memory circuit unit 106HG, switching means (NS1H) 106HG-1 and a capacitor (N1H) 106HG-2 are electrically connected to each other in series, and switching means (SS1H) 106HG-3 and a capacitor (S1H) 106HG-4 are electrically connected to each other in series. Those switching means and capacitors are used for the signal 1-1 102S1, and are connected to the signal line 107HG as illustrated in FIG. 1.

In the second row readout unit 102LG for outputting a signal 1-2 102S2, switching means (SW/AMPEN) 104LG for reading out the signal 1-2 102S2, a low gain amplifier 105LG, and an analog memory circuit unit 106LG are also arranged from the upstream side in the stated order, and are electrically connected to a signal line 107LG.

In the analog memory circuit unit 106LG, switching means (NS1) 106LG-1 and a capacitor (N1) 106LG-2 are electrically connected to each other in series, and switching means (SS1) 106LG-3 and a capacitor (S1) 106LG-4 are electrically connected to each other in series. Those switching means and capacitors are connected to the signal line 107LG as illustrated in FIG. 1.

In the third row readout unit 102N configured to output a signal 2 102SN, an analog memory circuit unit 106N is electrically connected to the pixel output signal line 103 via a signal line 107N1 differently from the first row readout unit 102HG and the second row readout unit 102LG.

In the analog memory circuit unit 106N, switching means (NS2) 106N-1 and a capacitor (N2) 106N-2 are electrically connected to each other in series, and switching means (SS2) 106N-3 and a capacitor (S2) 106N-4 are electrically connected to each other in series. Those switching means and capacitors are connected to the signal line 107N2 as illustrated in FIG. 1.

The readout unit 102 is common in pixel units of one row.

With the circuit configuration of FIG. 1, it is possible to achieve both of such a high sensitivity characteristic as to detect one photon and a high saturation characteristic, and to provide a high-sensitive image sensor having a broad dynamic range.

Two gain amplifiers (105HG and 105LG) arranged in the readout unit 102 are used at the time of reading out a high sensitive first signal from the pixel unit 101, and the signal 1-1 (102S1) having increased its amplitude and reduced noise in a later stage and the signal 1-2 (102S2) having increased a signal amplitude with an amplification ratio of "1" or less can be generated to obtain an ultra-high sensitive signal and a high sensitive signal.

Further, a high saturation second signal output from the pixel unit 101 is input to a signal readout path unit, to which the pixel signal output line is directly connected. On the basis of this input second signal, a high saturation signal ("signal 2 (102SN)") having the signal amplitude of the input second signal is read out from the signal readout path unit.

That is, from the above-mentioned three signals, the ultra-high sensitive signal 1-1 (102S1) fora pixel in an extremely low illuminance region, the signal 2 (102SN) for a pixel in a high illuminance region, and the signal 1-2 (102S2) for a pixel in an intermediate illuminance region are read out. Thus, a video (or picked-up image) signal can be obtained in a linear fashion for a single exposure period by reading out from an extremely low illuminance region to a high illuminance region.

In the description of FIG. 1, alphabetical letters inside "○" before a reference numeral represent the following technical meanings.

AMPEN . . . Switch for reading out "signal 1-1" and "signal 1-2"
NS1H . . . Switch for sampling "BG signal 1-1"
SS1H . . . Switch for sampling "optical signal 1-1"
N1H . . . Capacitor for holding "BG signal 1-1"
S1H . . . Capacitor for holding "optical signal 1-1"
NS1 . . . Switch for sampling "BG signal 1-2"
SS1 . . . Switch for sampling "optical signal 1-2"
N1 . . . Capacitor for holding "BG signal 1-2"
S1 . . . Capacitor for holding "optical signal 1-2"
NS2 . . . Switch for sampling "BG signal 2"
SS2 . . . Switch for sampling "optical signal 2"
N2 . . . Capacitor for holding "BG signal 2"
S2 . . . Capacitor for holding "optical signal 2"

Next, a description is further given of the features of this invention with reference to FIG. 2, FIG. 3A, FIG. 3B, FIG. 4A, FIG. 4B, and FIG. 5.

Figure 2:
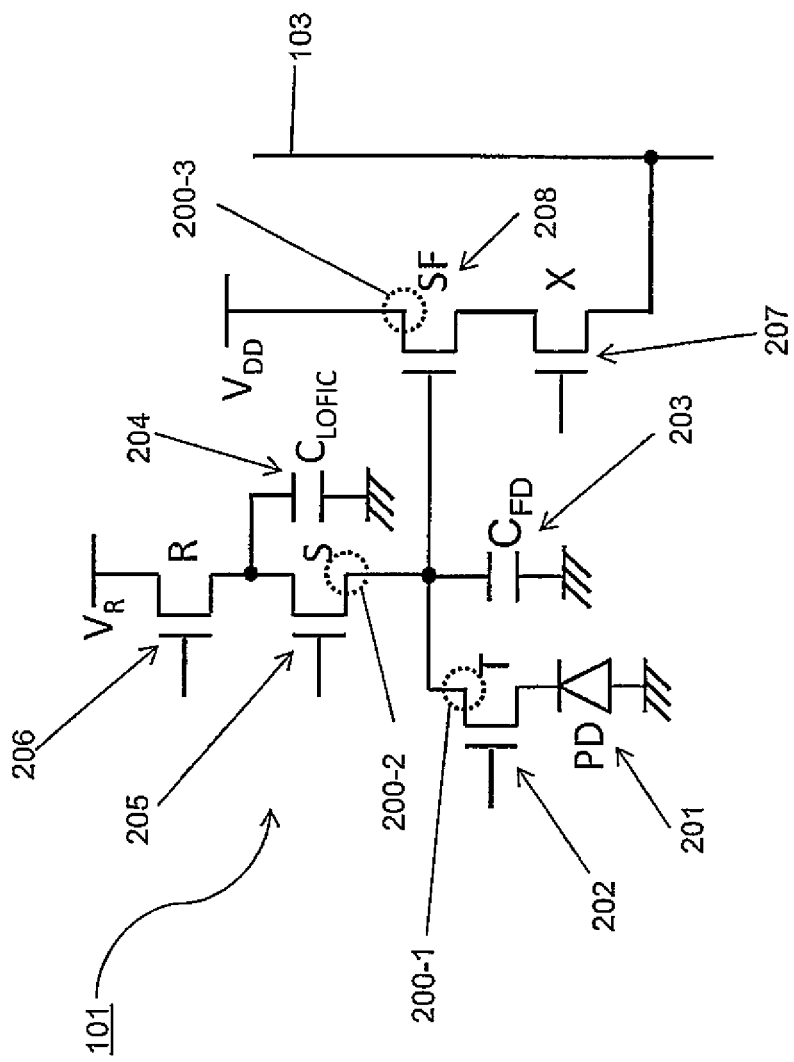
FIG. 2 is an equivalent circuit diagram for illustrating extraction of a pixel circuit unit from the circuit diagram illustrated in FIG. 1.

FIG. 2 is a diagram for illustrating the pixel unit 101 in the optical sensor unit 100 illustrated in FIG. 1.

The pixel unit 101 includes a photodiode (PD) 201, switching means (T) 202 for transfer, a floating diffusion capacitor ($C_{FD}$) (hereinafter sometimes referred to as "$C_{FD}$ capacitor") 203 configured to perform charge-to-voltage conversion, a lateral overflow integration capacitor ($C_{LOFIC}$) 204, switching means (S) 205 for overflow, switching means (R) 206 for resetting, pixel selection switching means (X) 207, and source-follower switching means (SF) 208.

The switching means (S) 205 for overflow is a switch for overflow and configured to combine or divide potentials of the $C_{FD}$ capacitor 203 and the lateral overflow integration capacitor ($C_{LOFIC}$) 204.

In FIG. 2, "$V_R$" represents a reset voltage, and "$V_{DD}$" represents a power supply voltage.

In this invention, the pixel unit 101 includes the $C_{LOFIC}$ capacitor 204, and thus the pixel unit 101 is hereinafter sometimes referred to as "LOFIC pixel unit".

Each switching means in the pixel unit 101 in this invention is preferably desired to be formed by a field effect transistor (FET), for example, a metal oxide semiconductor (MOS) transistor (MOSTr).

In FIG. 2, the switching means (T) 202 for transfer, the switching means (S) 205 for overflow, the switching means (R) 206 for resetting, the pixel selection switching means (X) 207, and the source-follower switching means (SF) 208 are each formed by a MOSTr.

The basic signal path in this invention is as follows.

Specifically, light input to the PD 201 generates a photocharge, and the generated photocharge is subjected to charge-to-voltage conversion by each of the $C_{FD}$ 203 and an integrated capacitor of the $C_{FD}$ 203 and the $C_{LOFIC}$ 204. Then, the obtained voltage is read out to a corresponding analog memory circuit unit among the analog memory circuit units 106HG, 106LG, and 106N via the SF 208, and is held as a voltage signal in an analog memory of the analog memory circuit unit. After that, the capacitance of the voltage signal is divided from the analog memory, read out to an outside of the device via an output buffer (not shown), and converted into a digital signal via an analog-digital convertor (ADC) (not shown).

In this series of signal paths, a larger amount of noise is superimposed on one another in a later stage of readout, resulting in a decrease in S/N. Thus, in this invention, a charge-to-voltage conversion gain in an earlier stage of the readout path, more specifically, in the $C_{FD}$ 203 is set to be the highest possible, to thereby relatively reduce the noise in a later stage of readout and achieve a high S/N.

This invention has been made based on a finding that the objects of this invention are achieved by optimizing (gate) overlap capacitances (200-1, 200-2, and 200-3) as shown by the broken-line circles of FIG. 2 in a repeated process of actually designing and manufacturing the device as an input sensor/device based on the pixel unit 101 illustrated in FIG. 2, measuring the sensitivity characteristics of the sensor, analyzing and examining the result, and giving feedback on the examination result to the designing and manufacturing process.

The capacitance forming the capacitor ($C_{FD}$) 203 is mainly divided into the following five types: a wiring parasitic capacitance (1) formed in wiring of the device, a PN junction capacitance (2) formed in an FD diffusion layer unit 504 (FIG. 5), a gate/board parasitic capacitance (3) formed in a pixel SF unit 505, a channel capacitance (4), and a gate overlap capacitance (5) formed in the FD diffusion layer unit and the pixel SF unit.

Among the five types of capacitances forming the capacitor ($C_{FD}$) 203, the wiring parasitic capacitance (1) can be reduced to some extent by arranging the FD diffusion layer unit 504 and the pixel SF unit 505 (FIG. 5) close to each other to reduce a wiring distance, and arranging adjacent metal wiring away from each other as far as possible. However, there is a limitation on reducing the wiring parasitic capacitance (1) in consideration of reducing the size of the pixel unit 101 (hereinafter also referred to as "pixel size") due to a request for increasing the density of the device.

As a method of improving the gate/board parasitic capacitance (3), a special process called a "well-in-well" process can be applied to the pixel SF unit 505 to reduce the gate/board parasitic capacitance (3). However, there is a problem in that the process becomes complicated and the pixel size becomes larger. Thus, it is not possible to satisfy both of reduction in pixel size and reduction in capacitance when the "well-in-well" process is adopted.

In addition, the inventors of this invention have concluded through examination that the gate/board parasitic capacitance (3) is relatively smaller than the other capacitances at the current time point, and thus improvement of the gate/board parasitic capacitance (3) is not currently required.

The channel capacitance (4) requires a channel for causing a certain amount of current to flow through the pixel SF unit 505, and thus the capacitance cannot be substantially expected to be reduced.

When "Cchl" denotes a channel capacitance of the switching means 208 of the source follower type, the capacitance (Cchl) mainly gives an effect on the capacitor ($C_{FD}$) 203 by a mirror effect, and the channel capacitance (4) effectively has "1/(gain of the switching means 208 of the source-follower type)"-fold of its capacitance.

Thus, when the "well-in-well" process is adopted as described above to eliminate a bias effect of the board and to set the gain of the switching means 208 of the source follower type to "1", the channel capacitance (4) can be suppressed. However, it is not possible to satisfy both of reduction in pixel size and reduction in capacitance when the "well-in-well" process is adopted.

Meanwhile, the PN junction capacitance (2) and the gate overlap capacitance (5) are capacitors for which capacitance cannot be expected to be reduced through improvement of the device layout or the readout method. Thus, in this invention, as described below, the manufacturing process is changed to reduce the capacitance. That is, this invention greatly changes the related-art method as described later in terms of the process of forming the gate overlap capacitance (5) and its condition, to thereby achieve optimization and reducing the capacitance of the $C_{FD}$ 203.

Figure 3A:
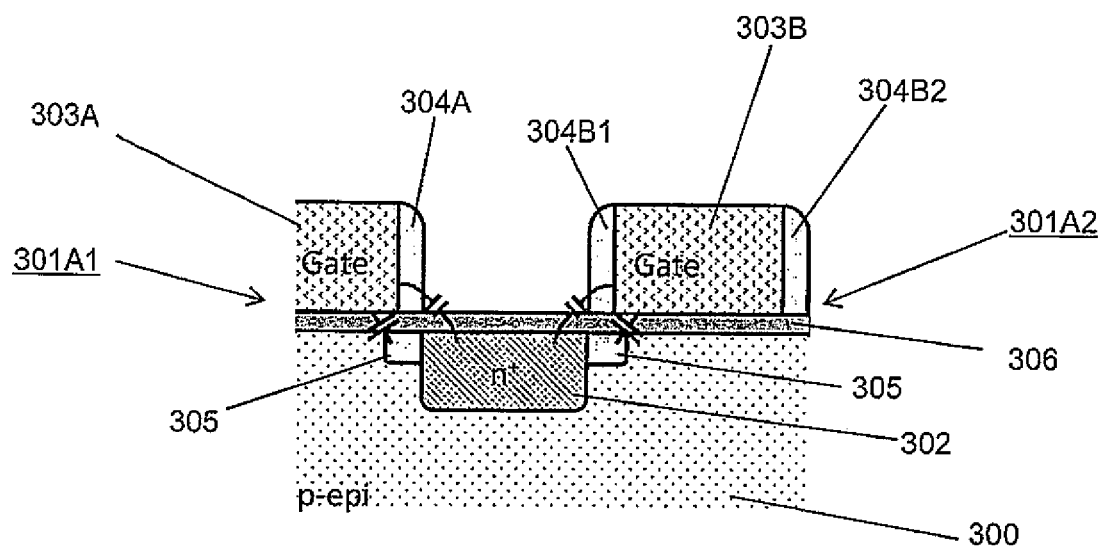
FIG. 3A is a schematic structural cross-sectional view for illustrating the structure of a general MOSTr.
Figure 3B:
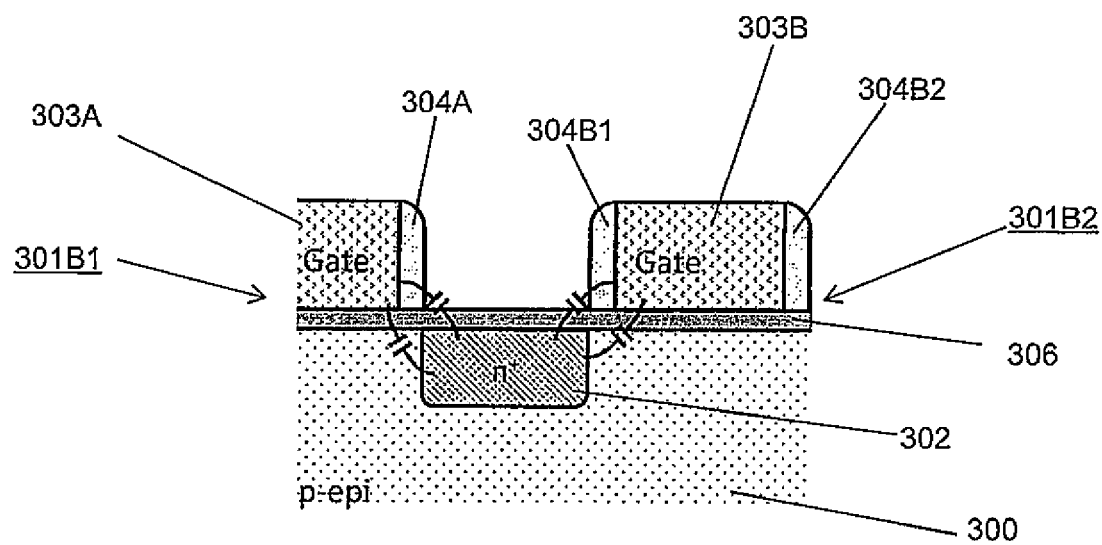
FIG. 3B is a schematic structural cross-sectional view for illustrating the structure of a MOSTr in one embodiment of this invention.

To describe the features of this invention, first, a description is given of omission of the lightly doped drain (LDD) to reduce the gate overlap capacitance with reference to FIG. 3A and FIG. 3B.

FIG. 3A is a schematic structural cross-sectional view for illustrating the structure of MOSTrs 301A1 and 301A2 having an LDD structure in one embodiment of this invention.

FIG. 3B is a schematic structural cross-sectional view for illustrating the structure of MOSTrs 301B1 and 301B2 having a non-LDD structure mentioned in the invention of the previous application (Patent Document 2) filed by the inventors of this invention and others.

In general, an LDD 305 is formed first between forming gate electrodes 303A and 303B and forming side walls 304A, 304B1, and 304B2. Next, the side walls 304A, 304B1, and 304B2 are formed, and a diffusion layer 302 is formed in the stated order.

A reason of forming the LDD 305 is for preventing the formed MOSTr from incurring degradation caused by hot carriers. That is, a part of electrons traveling from the source to the drain is accelerated by a high electric field near the drain to cause hot carriers of a high energy to occur. The hot carriers cause electrons or holes of a high energy by impact ionization, generate a defect near an interface between a gate insulating film and a semiconductor, or are injected into the gate insulating film and captured by a defect in the gate insulating film to become a fixed charge, resulting in temporal degradation in electric characteristics of the transistor. Generation of this hot carriers often occurs in a transistor having a channel length of 1 µm or less, and is a big issue in miniaturization of a general logic LSI.

In order to suppress generation of the hot carriers, the LDD 305 is formed by a diffusion layer having a low impurity concentration for mitigating the electric field near the drain. This type of transistor is generally called "LDD transistor". Further, in this application, a transistor without an LDD structure may be referred to as "non-LDD transistor".

Such an LDD transistor has the following problem.

As illustrated in FIG. 3A, the gate overlap capacitance would become large based on portions of the LDD 305 extended toward both sides of the gate electrodes 303A and 303B (extended portions of the LDD 305 are shown on both sides of the diffusion layer 302) in diffusion layer portions (portions of the diffusion layer 302 and the LDD 305).

Taking the above into account, in Patent Document 2 (prior application), formation of the LDD 305 is omitted so as to largely reduce the overlap capacitance. Further, it has been found through prototyping and experimental measurement of a transistor that, even when formation of the LDD 305 is omitted, an influence given by the above-mentioned hot carrier is sufficiently small under an operation voltage condition of the optical sensor, and there occurs no problem.

FIG. 3B is a schematic illustration of the capacitance relationship of a gate overlap portion in a case where formation of the LDD 305 is omitted, and is similar to that of FIG. 3A.

As apparent from FIG. 3B, the capacitance of the gate overlap portion is reduced more in the case of FIG. 3B than in the case of FIG. 3A.

A drain or a source of the transistor (301B1 or 301B2) in the case of FIG. 3B forms an end portion of the diffusion layer 302.

The following describes a change in process for reducing the capacitance.

The PN junction capacitance is determined based on a width of a depletion layer which would be formed over a p-epi layer 300 and an n⁺ layer (diffusion layer) 302. That is, as the width W of the depletion layer becomes wider, the capacitance of the PN junction becomes smaller. The width W of the depletion layer is determined based on the impurity concentrations of the p-epi layer 300 and the n⁺ layer 302.

In this invention, the impurity concentration of the n⁺ layer 302 is reduced and, thereby, the width W of the depletion layer becomes wide and, as a result, the capacitance of the PN junction capacitance is reduced.

Figure 4A:
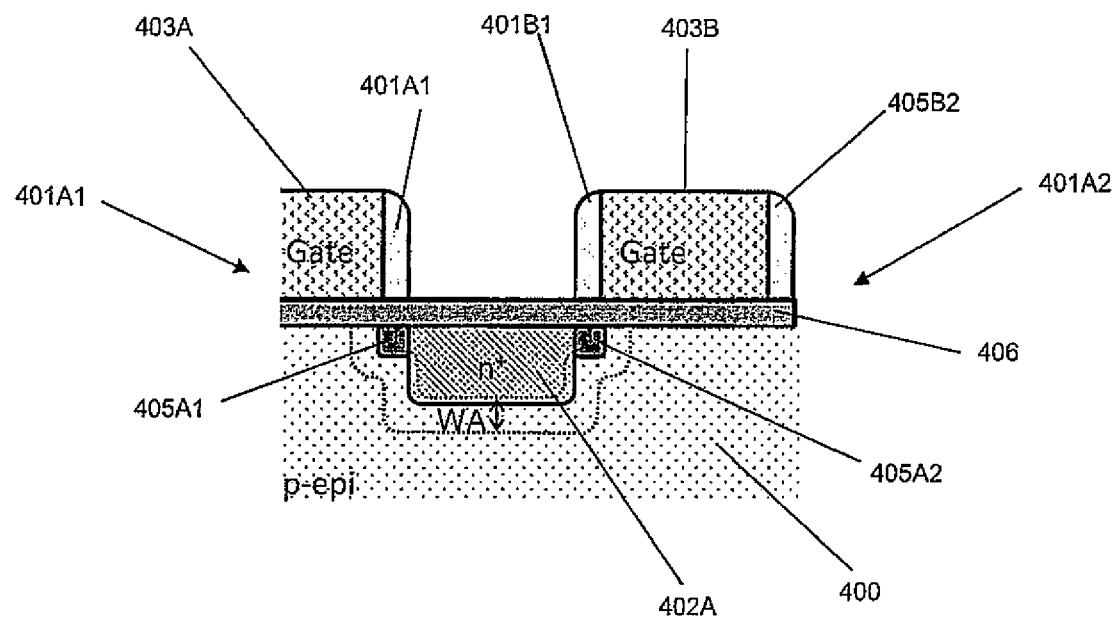
FIG. 4A is a schematic structural cross-sectional view for schematically illustrating extension of a width W of a formed depletion layer in a case where a diffusion layer having a general impurity concentration is provided.
Figure 4B:
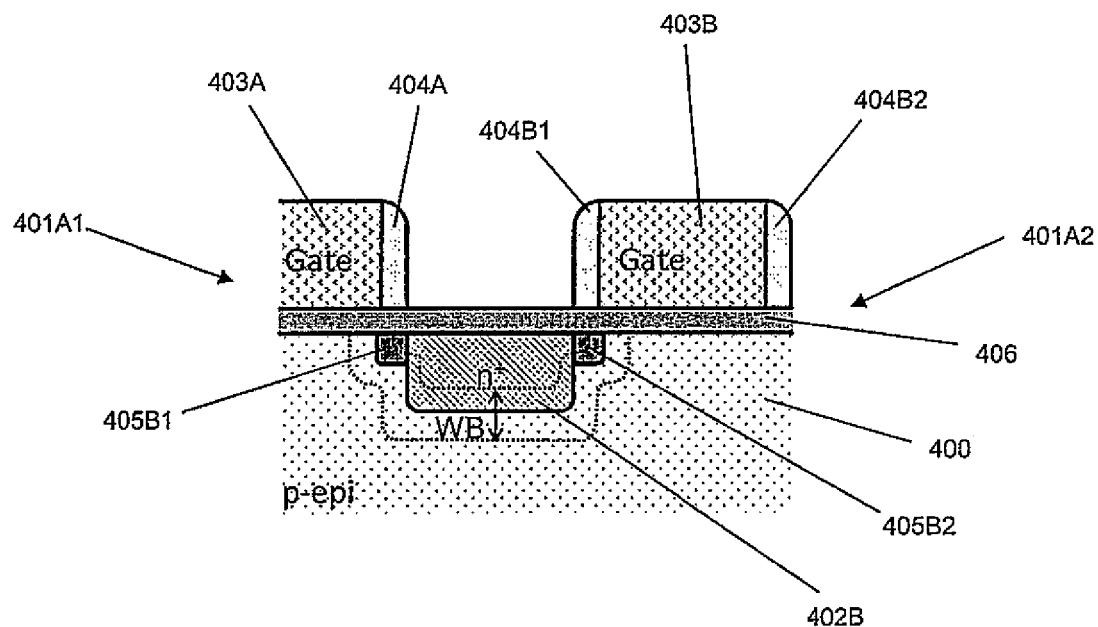
FIG. 4B is a schematic structural cross-sectional view for schematically illustrating extension of the width W of a depletion layer in a case where a diffusion layer having a smaller impurity concentration than usual is provided as in one embodiment of this invention.

FIG. 4A is a diagrammatic illustration wherein extension of the width W of the depletion layer is shown in a case where a diffusion layer 402A having a general impurity concentration and FIG. 4B is a diagrammatic illustration wherein extension of the width W of the depletion layer is shown in a case where a diffusion layer 402B having a smaller impurity concentration than usual as in this invention.

FIG. 4A is a schematic structural cross-sectional view for schematically illustrating extension of the width W of a formed depletion layer in a case where a diffusion layer having a general impurity concentration is provided in an LDD-MOSTr.

FIG. 4B is a schematic structural cross-sectional view for schematically illustrating extension of the width W of a depletion layer in a case where a diffusion layer having a smaller impurity concentration than usual is provided in the LDD-MOSTr as in this invention.

In FIG. 4A, a part of the structure of a MOSTr 401A1 and a MOSTr 401A2 are illustrated.

The diffusion layer 402A also serves as a drain region (left portion of the diffusion layer 402A in FIG. 4A) of the MOSTr 401A1 and a source region (right portion of the diffusion layer 402A in FIG. 4A) of the MOSTr 401A2.

When the impurity concentration of the diffusion layer 402A is high as in general diffusion layer, a width WA of the depletion layer becomes smaller as illustrated in FIG. 4A, and when the impurity concentration of the diffusion layer 402B becomes smaller as in this application, a width WB of the depletion layer becomes larger as illustrated in FIG. 4B.

The impurity concentration of the n⁺ layer (diffusion layer) can be reduced to increase the width of the depletion layer of the PN junction, and thus an effect of reducing the capacitance of the PN junction is obtained. Further, a distance between the charge in the n⁺ layer and the gate electrode becomes larger, and thus an effect of reducing the gate overlap capacitance is obtained like in omission of LDD formation.

Figure 5:
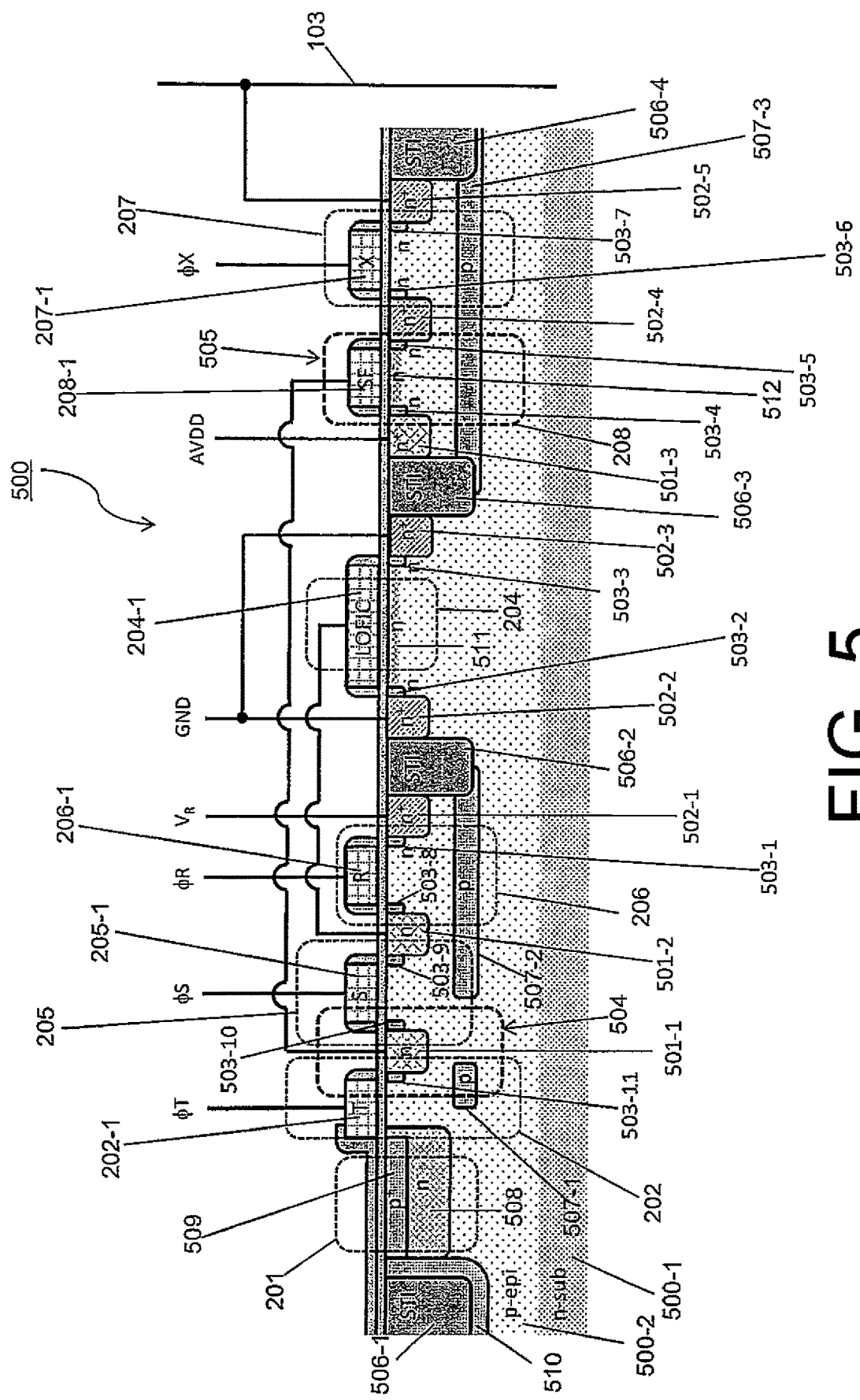
FIG. 5 is a schematic cross-sectional view for illustrating a layout of a device structure in a case where mission of LDD formation and a reduced impurity concentration of the diffusion layer are applied to a device including a pixel circuit unit 101 illustrated in FIG. 2.

Now, FIG. 5 is an illustration of an exemplary preferred embodiment of this invention in a case where omission of LDD and reduction of the impurity concentration of the diffusion layer are applied in relation to the description of FIG. 3A to FIG. 4B.

FIG. 5 is a schematic cross-sectional view for illustrating a layout of the device structure in a case where omission of LDD and reduction of the impurity concentration of the diffusion layer are applied at the time of formation of device structure of the optical input sensor unit 500 having a circuit configuration similar to that of the pixel circuit unit 101 illustrated in FIG. 2.

In FIG. 5, extraction electrodes (indicated by the solid line) are illustrated as a virtual electrode. Further, when the same portions as those of FIG. 1 and FIG. 2 are denoted in FIG. 5, corresponding reference numerals of FIG. 1 and FIG. 2 are used to denote those same portions.

The optical input sensor unit 500 is obtained by forming a p-type silicon layer 500-2 on an n-type silicon (n-Si) substrate 500-1 by epitaxial growth, and the p-type silicon layer 500-2 is used to form wiring of electronic elements such as a light receiving diode, a transistor, and a capacitor element based on the circuit design illustrated in FIG. 2.

In FIG. 5, n-type regions 501-1, 501-2, and 503-1 to 503-11, n⁺-type regions 502-1 to 502-5, n⁻-type regions 508, 511, and 512, and an n-type silicon (n-Si) 500-1 substrate contains n-type impurities doped at respective concentrations.

The doping concentration of n-type impurities in each region satisfies the following relationship.

(Concentration in $n^-$-type region)<(Concentration in $n$-type region)<(Concentration in $n^+$-type region)   (1)

The p-type silicon layer 500-2 and a p⁺-type region 510 near shallow trench isolation (STI) contain p-type impurities doped at respective concentrations.

The doping concentration of p-type impurities in each region satisfies the following relationship.

(Concentration in $p$-type region)<(Concentration in $p^+$-type region)   (2)

In the case of FIG. 5, the n-type regions 503-1 to 503-11 are LDDs.

N-type regions formed by reducing the amount of doped impurities compared to the related art in order to form a low capacitance FD are denoted by reference numerals 501-1, 501-2, and 501-3.

The n⁺-type regions 502-1, 502-2, 502-3, 502-4, and 502-5 contain impurities doped at a high concentration as in the related art.

The n-type regions 503-1, 503-2, 503-3, 503-4, 503-5, 503-6, and 503-7 are formed as LDDs as in the related art.

In this invention, the n-type regions (503-1 to 503-7) and the n⁺-type regions (502-1 to 502-5) may be referred to as "diffusion layer".

Among the electronic devices, those contributing to implementation of increasing the device performance by ensuring device separation have device separation regions 506-1, 506-2, 506-3, and 506-4 having required performance characteristics.

P-type embedded regions 507-1, 507-2, and 507-3 are provided at predetermined positions of the p-type silicon layer 500-2.

In FIG. 5, the photodiode (PD) 201 has a diode structure in which the n⁻ region 508 and the p⁺ region 509 are stacked.

In FIG. 5, the n-type region 511 in the lateral overflow integration capacitor ($C_{LOFIC}$) 204 and the n-type region 512 in the source-follower switching means (SF) 208 are desired to be provided from the following technical reasons.

The lateral overflow integration capacitor ($C_{LOFIC}$) is used as a capacitator having a gate insulation film as a dielectric. Thus, a constant capacitance value is desirably obtained at the widest possible voltage range, and an N-type embedded layer indicated by "n⁻ type" is preferably formed.

In this manner, through provision of an n⁻-type region, electrons can be constantly stored in the interface of a Si region and a gate insulation film in the voltage operation range, and a constant capacitance value is likely to be obtained.

In the source-follower switching means (SF), an embedded channel layer indicated by "n⁻ type" is preferred to be formed in order to reduce a low-frequency noise.

Through provision of the n⁻-type region, the channel is formed widely in the Si-width direction, and thus electrons are less likely to be captured in the trap of the gate insulation film, and the influence of the charged trap obtained by capturing electrons can be reduced. Therefore, it is possible to obtain a low low-frequency noise.

In this invention, the photodiode (PD) 201 can be changed to a photo transistor.

A wiring line ΦT is connected to an electrode 202-1 of the switching means T202 for transfer, a wiring line ΦS is connected to an electrode 205-1 of the switching means(S) 205 for overflow, a wiring line ΦR is connected to an electrode 206-1 of the switching means(R) 206 for resetting, and a wiring line ΦX is connected to an electrode 207-1 of the pixel selection switching means(X) 207.

The n⁺-type region 502-1 is operable as a drain of the switching means (R) 206 for resetting, and is connected to a wiring line $V_R$ for applying a resetting voltage.

An electrode 208-1 of the source-follower switching means (SF) 208 is electrically connected to the n-type region 501-1.

An electrode 204-1 of the lateral overflow integration capacitor ($C_{LOFIC}$) 204 is operable as one electrode of the capacitor ($C_{LOFIC}$) 204, and is electrically connected to the n-type region 501-2.

The n⁺-type regions 502-2 and 502-3 are electrically connected directly to a wiring GND.

The n⁺-type region 502-5 is electrically connected to directly the pixel output signal line 103.

Each switching means illustrated in FIG. 5 is formed by a MOSTr.

One of the features of this invention resides in the following relationships:

$$1 < N/N_D \le 100 \qquad (1); \text{ and}$$

$$0 < N \le 1.0 \times 10^{20} \text{ cm}^{-3} \qquad (2),$$

where, regarding the switching means (T) for transfer, $N_D$ represents the concentration of semiconductor impurities in the drain region, and N represents the concentration of semiconductor impurities in a diffusion region provided adjacent to that drain region.

In this invention, Expression (1) is preferably $1<N/N_D \leq 50$, and is, more preferably, $1<N/N_D \leq 10$. Expression (2) is preferably $1.0\times10^{10}$ cm$^{-3} \leq N \leq 5.0\times10^{19}$ cm$^{-3}$, and is, more preferably, $5.0\times10^{19}$ cm$^{-3} \leq N \leq 5.0\times10^{19}$ cm$^{-3}$.

Further, preferably, at least one of the switching means (S) for overflow or the source-follower switching means (SF) is desired to satisfy the above-mentioned relationship. More preferably, all of the switching means (T) for transfer, the switching means for overflow (S), and the source-follower switching means (SF) satisfy the above-mentioned relationship.

In this invention, the impurity concentrations of the n-type regions 501-1 and 501-3 are desired to be reduced by 50% in general, preferably by 70%, and more preferably by 90% with respect to the amounts of impurities (amounts of impurities of the n$^+$-type regions 502-1 to 502-5) in practical devices of the related art.

Specifically, the impurity concentrations are desired to be equal to or smaller than $1\times10^{20}$/m$^3$, preferably to be equal to or smaller than $6\times10^{19}$/cm$^3$, and more preferably to be equal to or smaller than $2\times10^{19}$/cm$^3$.

In this invention, as described above, the impurity concentrations of the n-type regions 501-1 and 501-3 are reduced to effectively achieve reduction of the capacitance of the capacitor ($C_{FD}$) 203. However, for example, reduction of the impurity concentrations of the n-type regions 502-1, 502-4, and 502-5 causes the increase in series resistance. As a result, the pixel signal output voltage range is narrowed down to reduce the dynamic range, the gain of the source-follower circuit is decreased to reduce the S/N, or shading is caused. Thus, it is not desired in terms of overall designing of the device that the impurity concentrations of the n-type regions 502-1, 502-4, and 502-5 be reduced compared to those of practical devices in the related art.

From such a viewpoint, in this invention, the impurity concentrations of the n-type regions 501-1 and 501-3 are preferably desired to be equal to or smaller than 50% of those of the n$^+$-type regions 502-1 to 502-5.

With the above-mentioned device configuration, the capacitance of the capacitor ($C_{FD}$) 203 (FIG. 2) is reduced, and it is possible to achieve both of such a high sensitivity characteristic as to detect one photon and a high saturation characteristic, to thereby provide a high-sensitive image sensor having a broad dynamic range.

The switching means (T) 202 for transfer, the switching means for overflow (S) 205, and the switching means (R) 206 for resetting are each only used for transferring charges stored in the photodiode (PD) 201 and resetting the capacitance of the photodiode (PD) 201, the capacitance of the capacitor ($C_{FD}$) 203, and the capacitance of the capacitor ($C_{LOFIC}$) 204 (about 10 fF in total of capacitances).

When the series resistance of the source-follower switching means (SF) 208 becomes larger, the gain is reduced. Thus, in this invention, as illustrated in FIG. 5, an LDD is provided in the source of a MOS transistor serving as the switching means 208 to prevent reduction of the gain.

Next, a schematic description is given of an example of manufacturing the optical input sensor unit 500 illustrated in FIG. 5.

The employed manufacturing technology is a general semiconductor manufacturing technology, and thus a description is omitted in such a range as to enable a person skilled in the art to easily understand the description (e.g., materials, chemicals, manufacturing conditions, and manufacturing apparatus).

The following work schedule indicates a main part of the manufacturing steps.

Steps (12) and (13) are steps for reducing the capacitance of the capacitor ($C_{FD}$) 203.

"Work Schedule"

Step (1): Formation of Device Isolation (Shallow Trench Isolation: STI) (506-1 to 506-4).
Step (2): Formation of Well/Channel Stop Layer (507-1 to 507-3, and 510) and Injection of Ion
Step (3): Annealing for Activation
Step (4): Formation of Gate Insulation Film
Step (5): Formation of Gate Electrode Film
Step (6): Patterning of Gate Electrode
Step (7): Formation of PD-embedded n$^-$ layer (508) and Injection of Ion
Step (8): Formation of PD-surface p$^+$ layer (509) and Injection of Ion
Step (9): Formation of Lightly Doped Drain (LDD) and Injection of Ion "photolithography→Injection of Ion→Resist Removal"
Step (10): Annealing for Activation
Step (11): Formation of Sidewall
Step (12): Formation of S/D Diffusion Layer (501-1 to 501-3, and 502-1 to 502-5) and Injection of Ion (1) "Photolithography→Injection of Ion→Resist Removal"
Step (13): Formation of S/D High-concentration Diffusion Layers (502-1 to 502-5) and Injection of Ion (2) "Photolithography→Injection of Ion→Resist Removal"
Step (14): Annealing for Activation
Step (15): Formation of First Interlayer Film (605-1)
Step (16): Formation of Contact Hole
Step (17): Formation of Contact Electrodes (606-1 to 606-3)
Step (18): Formation of Metal Wiring (607-1 and 607-2)
Step (19): Hydrogen Sintering The schematic structural diagram of the optical input sensor unit 500 obtained by the above-mentioned steps is illustrated in FIG. 6.

Figure 6:
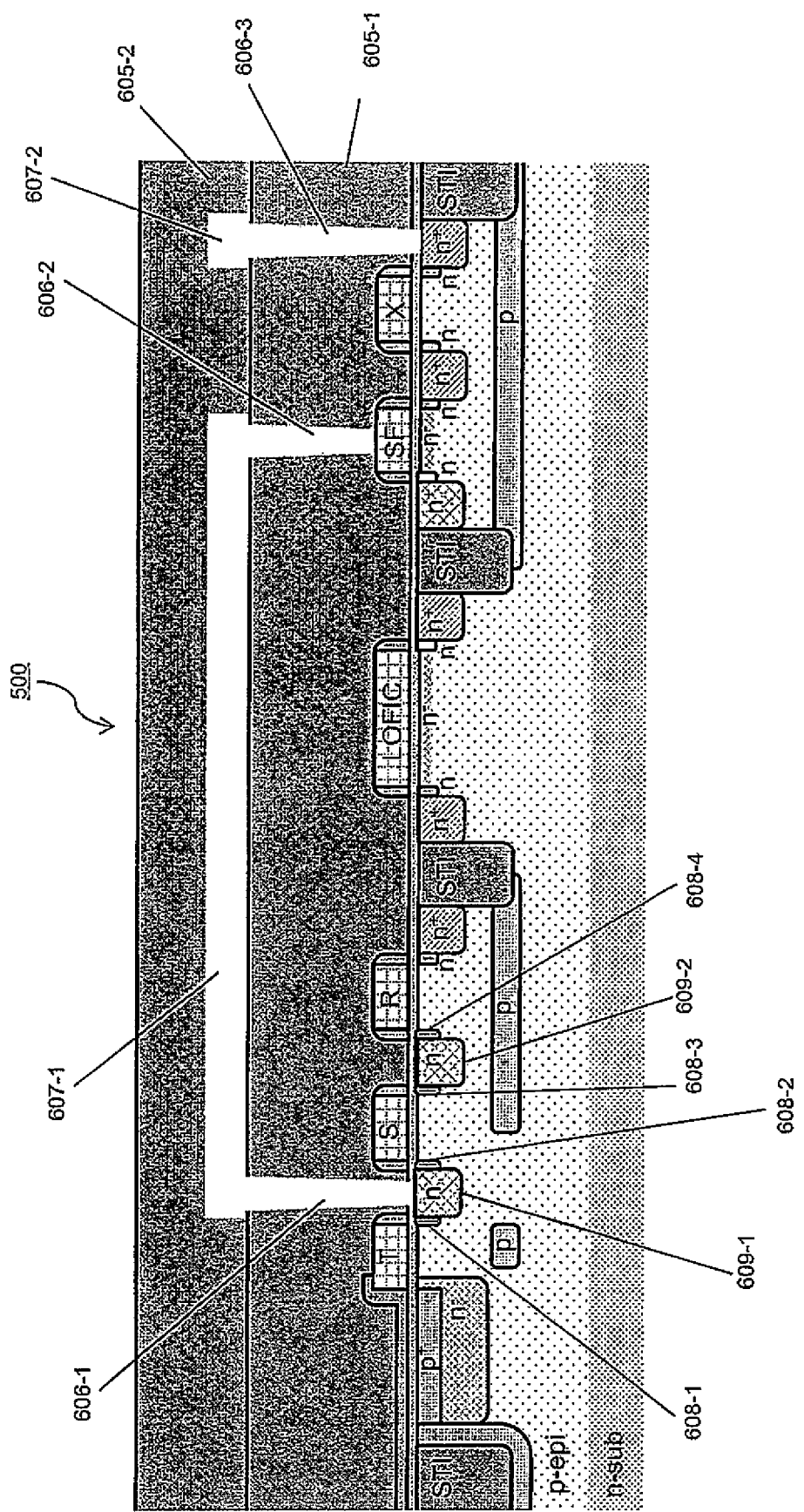
FIG. 6 is a schematic structural view for illustrating an optical input sensor unit 500 manufactured by one of preferred manufacturing processes.

In FIG. 6, reference numerals 605-1 and 605-2 indicate wiring-interlayer insulation layers, reference numerals 606-1 to 606-3 indicate contact electrodes, reference numerals 607-1 and 607-2 indicate metal wiring lines, reference numerals 608-1 to 608-4 indicates LDDs, and reference numerals 609-1 and 609-2 indicate diffusion layers.

Next, with reference to FIG. 1 and FIG. 2, a description is given of one preferred example in a case where this invention is applied to a high-sensitive CMOS image sensor (solid-state image pickup device) operable as an image input device.

In this example, a high-sensitive CMOS image sensor of a photoelectron detection type is described. However, it is to be understood that, even when the polarity of the device structure is reverse, the high-sensitive CMOS image sensor falls within the scope of this invention.

Supersaturation charges, which have flowed out due to a supersaturation state in which the amounts of charges stored in the photodiode (PD) 201 and the floating diffusion capacitor ($C_{FD}$) 203 exceed those capacitances during an storage period (ST) (period in which photocharges caused by receiving an imaging light are stored in a predetermined capacitor), are stored in the lateral overflow integration capacitor ($C_{LOFIC}$) 204 via the switching means for overflow (S) 205.

The amount of charges (charge signal) stored in the capacitor ($C_{FD}$) 203 having a small capacitance value is converted into a voltage signal corresponding to an equivalent voltage value, and is output as a first signal (A1-1) from the pixel unit 101.

When any one of the switching means 104HG or the switching means 104LG turns ON, depending on the size of the value (indicatable by the voltage value or original amount of charges), the above-mentioned output first signal (A1-1) is input to any one of the first row readout unit 102HG or the second row readout unit 102LG.

That is, when the value of the first signal (A1-1) is larger than a predetermined value (in the case of an ultra-high sensitive light receiving signal under ultra-lower illuminance), the switching means 104HG is turned ON, and the first signal (A1-1) is input to the first row readout unit 102HG. The input first signal (A1-1) is amplified by an amplification factor larger than "1" by the high gain amplifier 105HG, and is temporarily stored in the analog memory circuit unit 106HG as an amplification signal AM1. After that, the signal 1-1 (102S1) that depends on the amplification signal AM1 is read out from the first row readout unit 102HG.

When the value of the output first signal (A1-1) is equal to or smaller than the predetermined value (in the case of a high sensitive light receiving signal under low illuminance), the switching means 104LG is turned ON, and the first signal (A1-1) is input to the second row readout unit 102LG. The input first signal (A1-1) is amplified by an amplification factor equal to or smaller than "1" by the low gain amplifier 105LG, and is temporarily stored in the analog memory circuit unit 106LG as an amplification signal AM2. After that, the signal 1-2 (102S2) that depends on the amplification signal AM2 is read out from the second row readout unit 102LG.

Next, the amount of charges (charge signal) stored in a capacitor having a large capacitance value, which is obtained by adding the capacitance of the floating diffusion capacitor ($C_{FD}$) 203 and the capacitance of the lateral overflow integration capacitor ($C_{LOFIC}$) 204, is converted into a voltage signal corresponding to the equivalent voltage value, and is output from the pixel unit 101 as a second signal (A1-2).

The output second signal (A1-2) is input to the third row readout unit 102N. The input second signal (A1-2) is temporarily stored in the analog memory circuit unit 106N. After that, the signal 2 (102SN), which depends on the stored second signal (A1-2), is read out from the third row readout unit 102N.

The signal is read out from the readout unit 102 through sequential selection of a row by a scanning circuit (not shown) arranged in the horizontal direction.

In this case, A/D conversion means (ADC) may be provided in the readout unit of each row so that each signal is subjected to analog-to-digital conversion for each row in the device chip and the digital signal is read out to the outside of the device chip.

In this invention, a different amplification factor is applied to the first signal (A1-1) for amplification depending on whether the first signal (A1-1) is a signal (ultra-high sensitive light receiving signal under ultra-low illuminance) obtained in an illumination light region of an ultra-small amount of light, or a signal (high sensitive light receiving signal under low illuminance) obtained in an illumination light region of an amount of light that exceeds that of the illumination light region of an ultra-small amount of light.

In this invention, a criterion for switching between the amplification factors is appropriately determined as desired depending on the level of the first signal (A1-1), but, for example, the value (amplification factor) of a gain larger than 1 is preferably set to be 16 times when the level of the signal is about 250 electrons in terms of the amount of charges.

In a prototype device of this invention, for example, the amplification factor of the high gain amplifier 105HG is set to be 16 times, and the amplification factor of the low gain amplifier 105LG is set to be 1.

The signal amplification factor of the high gain amplifier 105HG is desired to be high in order to reduce an influence of noise that occurs in a downstream circuit of the readout unit 102 as long as a difference in amplification factor between the high gain amplifier 105HG and the low gain amplifier 105LG is kept within a fixed range so that a signal-to-noise ratio at the time of combining the signal 1-1 (102S1) and the signal 1-2 (102S2) causes both of the signal 1-1 (102S1) and the signal 1-2 (102S2) to be equal to or larger than a fixed value. In this invention, the amplification factor is desired to be larger than "1".

From the description given above, it is possible to combine the most high-sensitive signal 1-1 (102S1), the second most high-sensitive signal 1-2 (102S2), and the high-saturation signal 2 (102SN) to obtain a high sensitive signal of the signal 1-1 (102S1), and to obtain a picked-up image signal in a broad dynamic range within one exposure period.

Figure 7:
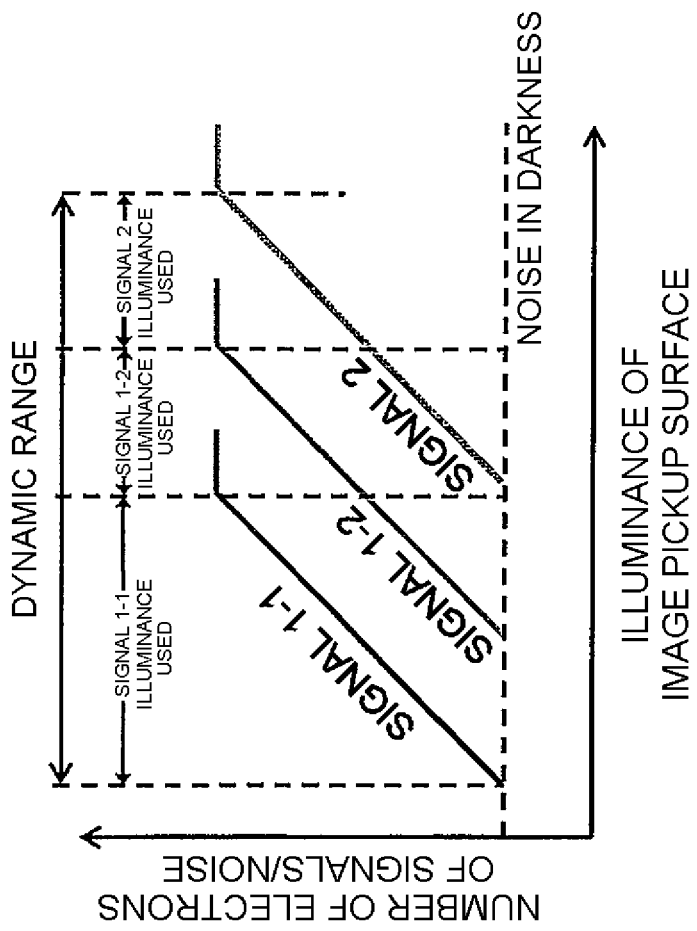
FIG. 7 is a schematic explanatory conceptual graph for showing photoelectric conversion characteristics of a signal 1-1, a signal 1-2, and a signal 2.
Figure 8:
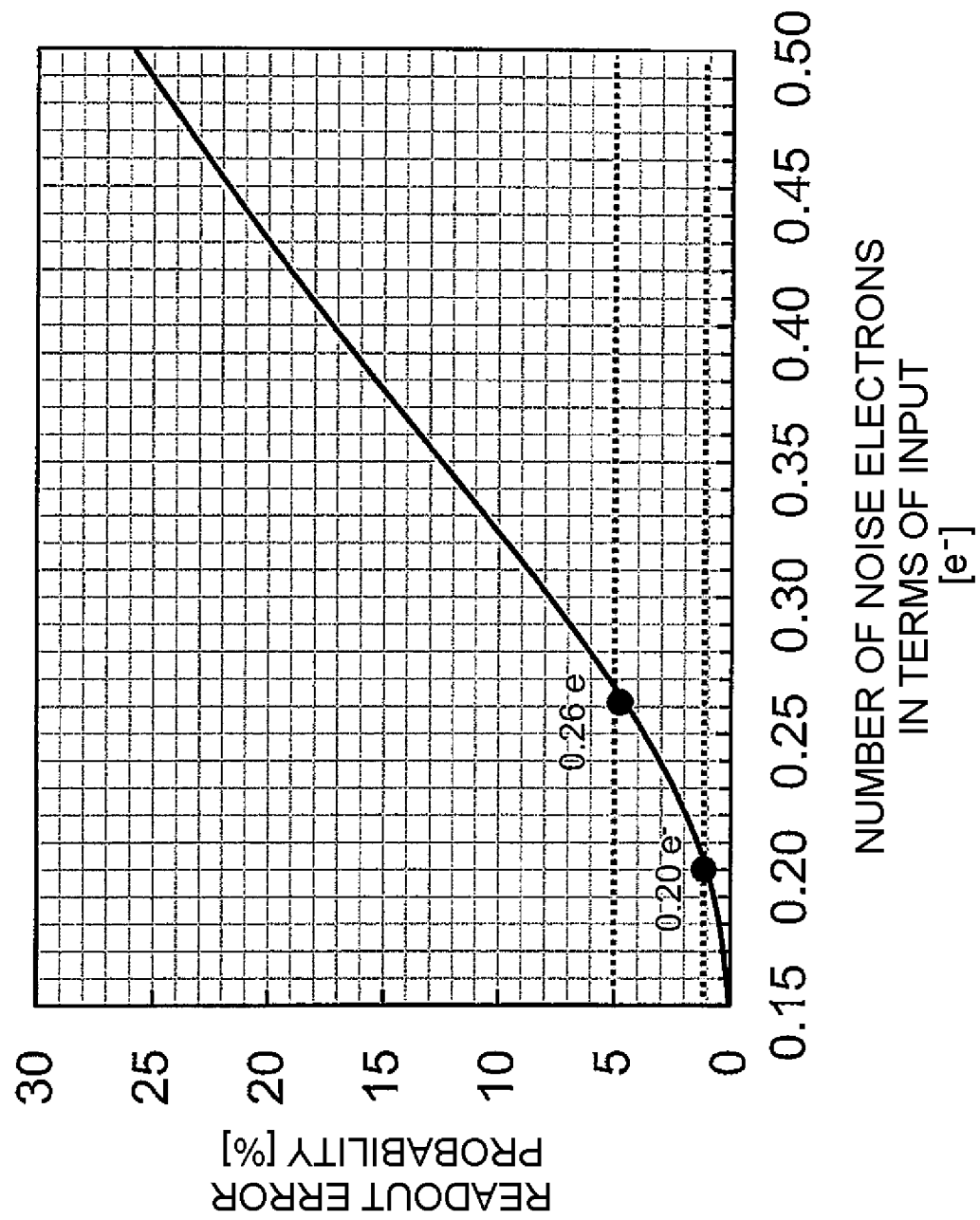
FIG. 8 is a graph for showing a relationship between the number of noise electrons calculated in terms of floating diffusion input and a readout error probability.

That is, a signal obtained by combining the "signal 1-1 (102S1)", the "signal 1-2 (102S2)", and the "signal 2 (102SN)" is a "picked-up image signal", and the "picked-up image signal" can be obtained in a wide dynamic range and a high-sensitive manner within one exposure period, that is, the "picked-up image signal" can be obtained in a broad range of from a signal obtained from a dark pixel of about 1 photon to a signal obtained from a high-illuminance signal within one exposure period. FIG. 7 and FIG. 8 are illustrations for conceptually illustrating this point.

FIG. 7 is a schematic explanatory conceptual graph for showing photoelectric conversion characteristics of the signal 1-1(102S1), the signal 1-2 (102S2), and the signal 2 (102SN).

FIG. 8 is a graph for showing a relationship between the number of noise electrons calculated in terms of floating diffusion input and a readout error probability.

In this case, reading is defined to be successful when photocharges input to floating diffusion have successfully been read out one by one.

It has been found that, when the number of noise electrons calculated in terms of input is set to be equal to or smaller than 0.26, the reading error probability can be reduced to be smaller than 5%, and the signal can be read out with an accuracy of one photon with substantially no problem. Further, it has also been found that, when the number of noise electrons calculated in terms of input is preferably set to be equal to or smaller than 0.20, the reading error probability can be reduced to be smaller than 1%.

Those matters have been confirmed through repetition of device design, simulation, manufacturing, device drive, analysis, and examination.

Figure 9:
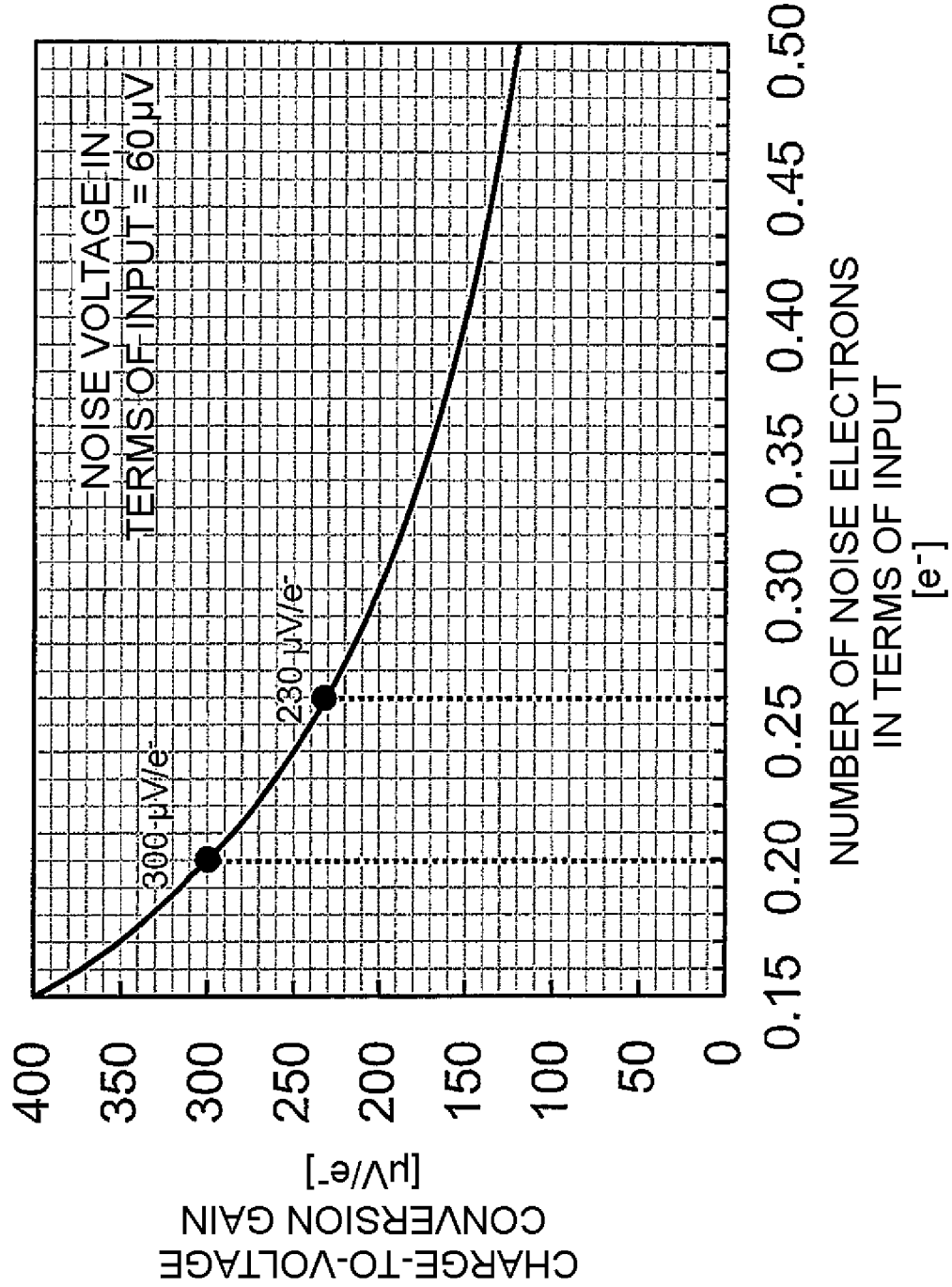
FIG. 9 is a graph for showing a relationship between the number of noise electrons calculated in terms of input and a charge-to-voltage conversion gain.

FIG. 9 is a graph for showing a relationship between the number of noise electrons calculated in terms of input and a charge-to-voltage conversion gain.

Figure 10:
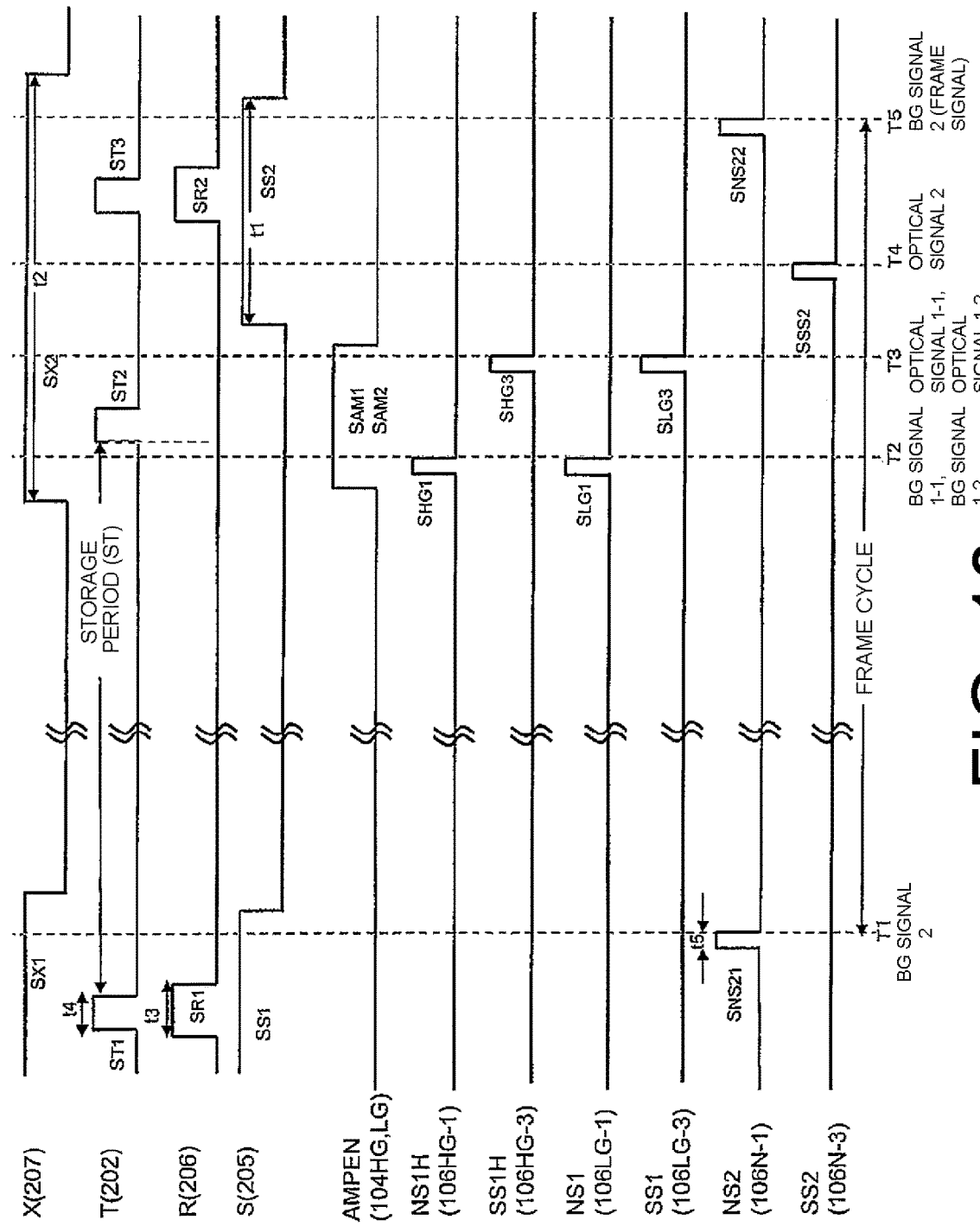
FIG. 10 is a timing chart for illustrating a case of reading out a signal of one pixel.
Figure 11A:
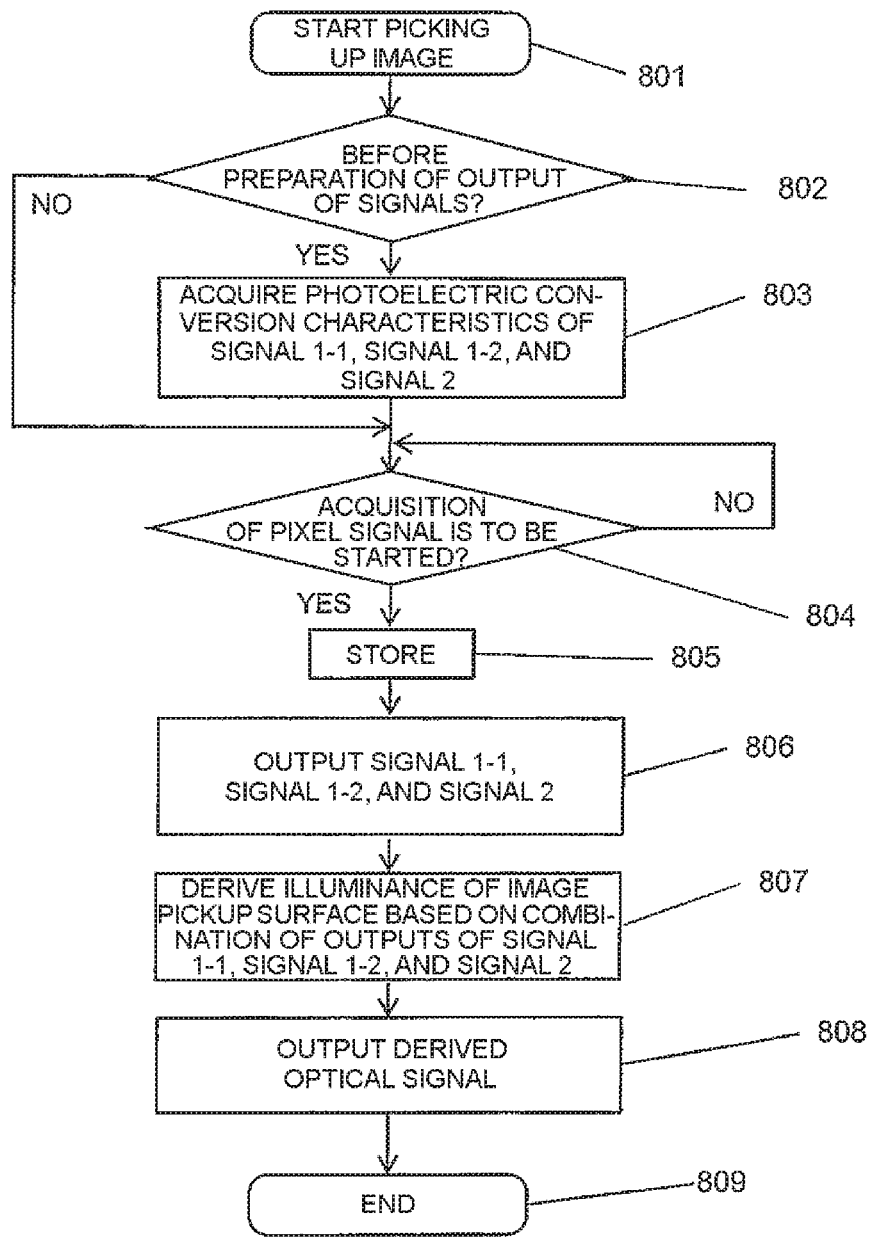
FIG. 11A is a flow chart for illustrating a procedure of reading out a signal of one pixel.

Now, with reference to FIG. 10 and FIG. 11A, a description is given of a method of picking up an image by the image pickup device according to this invention, and reading out an image signal based on the picked-up image.

In this case, a method of outputting a pixel signal of the device in this invention described below is a pixel signal output method carried out by the use of a source-follower circuit including the source-follower switch (SF) 208 and the row current source 108.

In this invention, the method is not limited to this pixel signal output method. Instead, use may be made about a method which includes reading out a floating capacitor load by setting the pixel output line 103 to a floating state after resetting thereof, driving the source-follower switch (SF) by a capacitor load parasitic on the pixel output line 103, and outputting a pixel signal.

FIG. 10 is a timing chart in a case where a signal of one pixel is read out. In FIG. 10, when the switching means (T) 202 for transfer is turned ON/OFF (pulse ST1) and next turned ON/OFF (pulse ST2), a period of from the OFF point of the first ON/OFF until the ON point of the next ON/OFF represents an storage period (ST).

T1 to T5 indicate end timings of sampling signals to the analog memory.

Sampling of signals to the analog memory is started when the pulse is turned ON. The switching means (R) 206 for resetting and the switching means (T) 202 for transfer are turned ON in order within a period in which the switching means for overflow (S) 205 and the pixel selection switching means (X) 207 maintain the ON state for predetermined respective periods of time (t1 and t2), and maintain the ON state for predetermined respective periods of time (t3 and t4).

OFF timings of the switching means for overflow (S) 205 and the pixel selection switching means(X) 207 are selected at a timing at which the pixel selection switching means(X) 207 is turned OFF after the switching means for overflow (S) 205 is turned OFF.

The switching means (R) 206 for resetting and the switching means (T) 202 for transfer are turned ON/OFF (pulse $S_{R1}$ and pulse $S_{T1}$) before the switching means for overflow (S) 205 is turned OFF.

The timing of turning ON/OFF of the switching means (T) 202 for transfer falls within an ON/OFF period (predetermined period (t3)) of the switching means (R) 206 for resetting.

After the switching means (T) 202 for transfer, the switching means (R) 206 for resetting, and the switching means for overflow (S) 205 are turned OFF in order, the switching means (NS2) 106N-1 is turned ON for a predetermined period (t5). After the predetermined period (t5) has elapsed, the switching means (NS2) 106N-1 is turned OFF.

The timing of turning OFF of the switching means (NS2) 106N-1 is selected before the switching means for overflow (S) 205 is turned OFF. After that, the pixel selection switching means (X) 207 is turned OFF.

After the pixel selection switching means(X) 207 is turned ON again, first, the switching means (SW/AM PEN) 104HG and the switching means (SW/AMPEN) 104LG are turned ON.

Next, the switching means (NS1H) 106HG-1 and the switching means (NS1) 106LG-1 are turned ON/OFF (pulse SHG1 and pulse SLG1) at the same time.

Next, the switching means (T) 202 for transfer is turned ON/OFF (pulse ST2), and after that, the switching means (SS1H) 106HG-3 and the switching means (SS1) 106LG-3 are turned ON at the same time.

The switching means (SW/AMPEN) 104HG and the switching means (SW/AMPEN) 104LG are turned OFF (pulse SAM1 and pulse SAM2) at a timing after the switching means (SS1H) 106HG-3 and the switching means (SS1) 106LG-3 are turned OFF from this ON state at the same time.

After the switching means (SW/AMPEN) 104HG and the switching means (SW/AMPEN) 104LG are turned OFF, the switching means for overflow (S) 205 is turned ON (pulse SS2), and next, the switching means (SS2) 106N-3 is turned ON/OFF (pulse SSS2).

Next, the switching means (R) 206 for resetting and the switching means (T) 202 for transfer are turned ON in order.

The switching means (T) 202 for transfer and the switching means (R) 206 for resetting are turned OFF in order (pulse ST3 and pulse SR2) within a period (width t1 of pulse SS2) in which the switching means for overflow (S) 205 is in the ON state.

Next, the switching means (NS2) 106N-1 is turned ON/OFF (pulse SNS22). The switching means for overflow (S) 205 is turned OFF (pulse SS2) after the switching means (NS2) 106N-1 is turned OFF (pulse SNS22).

In this case, when an amount of photocharges that exceeds the saturation amount of charges of the PD 201 has occurred in the PD 201 within the storage period (ST), the photocharges exceed a potential barrier of the switching means (T) 202 for transfer, and overflow to capacitor ($C_{FD}$) 203 from the PD 201. Further, when the amount of photocharges that exceeds the saturation amount of charges of the capacitor ($C_{FD}$) 203 has overflowed to the capacitor ($C_{FD}$) 203, the photocharges exceed the potential barrier of the switching means (S) 205, and overflow to the integration capacitor ($C_{LOFIC}$) 204.

During a period in which the switching means (X) 207 is ON (corresponding to the pulse width t2 between a pulse SX1 and a pulse SX2), the pixel is coupled to the row output line 103, and the following signals are output in order.

While the switching means (SW/AMPEN) 104HG and the switching means (SW/AMPEN) 104LG are ON, the gain amplifier 105HG and the gain amplifier 105LG become active.

The switching means (SW/AMPEN) 104HG and the switching means (SW/AMPEN) 104LG are turned ON before the switching means (T) 202 for transfer is turned ON and within the storage period (ST).

After that, the switching means (NS1H) 106HG-1 and the switching means (NS1) 106LG-1 are turned ON/OFF (pulse SHG, and pulse SLG1), each of a BG signal 1-1 and a BG signal 1-2 is read out, and those signals are held in the corresponding capacitor (N1H) 106HG-2 and capacitor (N1) 106LG-2, respectively.

In this case, the signal 1-1 and the signal 1-2 contain signals (noise signals) corresponding to reset noise of the capacitor ($C_{FD}$) 203, a threshold variation of the switching means (SF) 208, and offset voltages of the gain amplifier 105HG and the gain amplifier 105LG.

Next, the switching means (T) 202 for transfer is turned ON/OFF (pulse ST2) to receive light, to thereby cause charges (sometimes referred to as "photo charges") that have been generated in the PD 201 to be completely transferred to the floating diffusion capacitor ($C_{FD}$) 203.

At this time, when the amount of photocharges is larger than the saturation amount of charges of the capacitor ($C_{FD}$) 203, the over-saturation amount of photocharges exceeds the potential of the switching means (S) 205, and overflows to the integration capacitor ($C_{LOFIC}$) 204. The photocharges that have been transferred to the capacitor ($C_{FD}$) 203 are subjected to charge-to-voltage conversion depending on the capacitance value of the capacitor ($C_{FD}$) 203.

After the switching means (T) 202 for transfer is turned OFF (OFF of pulse ST2), the switching means (SS1H) 106HG-3 and the switching means (SS1) 106LG-3 are turned ON/OFF (pulse SHG3 and pulse SLG3), each of the optical signal 1-1 and the optical signal 1-2 is read out, and those signals are held in the corresponding capacitor (S1H) 106HG-4 and capacitor (S1) 106LG-4, respectively. A signal readout end timing T3 arrives when the switching means (SS1H) 106HG-3 and the switching means (SS1) 106LG-3 are turned OFF.

In this case, the optical signal 1-1 and the optical signal 1-2 are signals obtained by adding, to the BG signal 1-1 and the BG signal 1-2, a signal that has been generated depending on the amount of photocharges transferred to the capacitor ($C_{FD}$) 203. In the subsequent circuit, correlated double sampling, namely, subtraction of the BG signal 1-1 from the optical signal 1-1 and subtraction of the BG signal 1-2 from the optical signal 1-2 enable only the signals that have occurred depending on the amount of photocharges to be obtained. It is to be understood that a gain amplifier having a correlated double sampling function may be used as the gain amplifiers 105HG and 105LG.

After the optical signal 1-1 and the optical signal 1-2 are read out to the capacitor (S1H) 106HG-4 and the capacitor (S1) 106LG-4, respectively, the switching means (SW/AM PEN) 104HG and the switching means (SW/AMPEN) 104LG are turned OFF, and the gain amplifiers 105HG and 105LG become inactive.

After that, the switching means (5) 205 is turned ON, and potentials of the capacitor ($C_{FD}$) 203 and the integration capacitor ($C_{LOFIC}$) 204 are combined.

At this time, when there are charges that have overflowed from the capacitor ($C_{FD}$) 203 and are stored in the integration capacitor ($C_{LOFIC}$) 204 within the storage period (ST) or the storage period (ST) and a transfer period (TT), charges stored in the integration capacitor ($C_{LOFIC}$) 204 and charges transferred to and stored in the capacitor ($C_{FD}$) 203 are mixed with each other via the switching means (5) 205, and are subjected to charge-to-voltage conversion by an integrated capacitor of the integration capacitor ($C_{LOFIC}$) 204 and the capacitor ($C_{FD}$) 203.

When there is no overflow from the capacitor ($C_{FD}$) 203 and charges are not stored in the integration capacitor ($C_{LOFIC}$) 204, the charges transferred to the capacitor ($C_{FD}$) 203 are subjected to charge-to-voltage conversion by an integrated capacitor of the integration capacitor ($C_{LOFIC}$) 204 and the capacitor ($C_{FD}$) 203.

In this case, the switching means (T) 202 for transfer may be turned ON/OFF under a state in which the switching means (S) 205 is ON in order to transfer photocharges stored in the photodiode (PD) 201 to the capacitor ($C_{FD}$) 203 and the integration capacitor ($C_{LOFIC}$) 204 from the OFF timing of turning ON/OFF of the switching means (T) 202 for transfer by the pulse ST2.

After that, during the period (t1) in which the switching means (S) 205 is ON, the switching means (SS2) 106N-3 is turned ON/OFF (pulse SSS2) so that the second optical signal is read out to the capacitor (S2) 106N-4 and held. The readout end timing at this time is T4.

Next, the switching means (R) 206 is turned ON, and the integration capacitor ($C_{LOFIC}$) 204 and the capacitor ($C_{FD}$) 203 are started to be reset.

After that, the switching means for transfer (T) 205 is turned ON, and the PD 201 is started to be reset.

Next, the switching means (R) 206 is turned OFF, and the resetting of the integration capacitor ($C_{LOFIC}$) 204 and the capacitor ($C_{FD}$) 203 are completed.

At this time, the integration capacitor ($C_{LOFIC}$) 204 and the capacitor ($C_{FD}$) 203 each take in reset noise. However, as described above, such reset noise can be removed as described above to obtain only the signals that depend on the amount of received light.

After that, the switching means (NS2) 106N-1 is turned ON/OFF (pulse $S_{NS22}$) to cause the BG signal 2 to be read out to the capacitor (N2) 106N-2 and held.

After that, the switching means (S) 205 is turned OFF, and potentials of the integration capacitor ($C_{LOFIC}$) 204 and the capacitor ($C_{FD}$) 203 are dis-combined.

Next, the switching means (X) 207 is turned OFF, and the pixel is separated from the output line to advance to a period in which pixels in another row are read out.

Figure 12A:
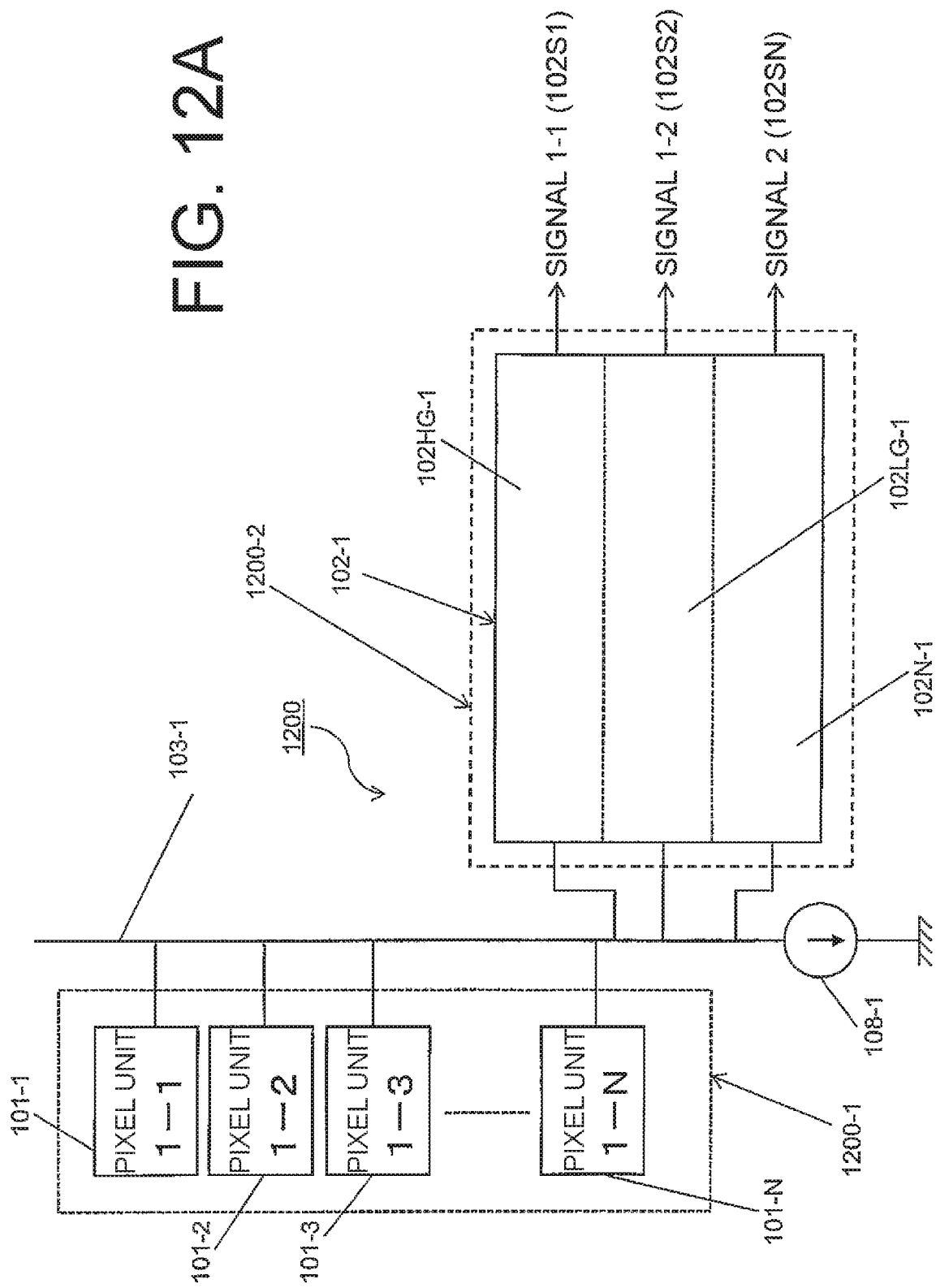
FIG. 12A is a circuit diagram for illustrating an example of a sensor unit including one row of N pixel units and one row of signal readout path units in a case where the CMOS image sensor in one embodiment of this invention is applied to an image pickup device in a preferred embodiment of this invention.

FIG. 11A is a flow chart for illustrating a procedure of reading out (picking up an image of) a signal of one pixel in the example of FIG. 1 and FIG. 12A. The procedure illustrated in FIG. 11A is executed by a control circuit (not shown) configured to operate in accordance with a computer program.

When an image is started to be picked up (Step 801), it is determined whether or not the current time is before preparation of output of signals (Step 802). When the current time is before preparation of output of signals, the processing proceeds to Step 803 of acquiring the photoelectric conversion characteristics of the signal 1-1 102S1, the signal 1-2 102S2, and the signal 2 102SN. When acquisition of the photoelectric conversion characteristics of respective signals is complete, the processing proceeds to Step 804. When the current time is not before preparation of output of signals in Step 802, the processing proceeds to Step 804. In Step 804, it is determined whether or not to start acquisition of a pixel signal. The pixel signal that has started to be acquired is stored in Step 805. When it is determined that acquisition of a pixel signal is not to be started, the processing returns to Step 804 again to determine whether or not to start acquiring a pixel signal. Each signal (signal 1-1 102S1, signal 1-2 102S2, and signal 2 102SN) stored in Step 804 is output in Step 806 for transfer to the subsequent circuit.

Next, a combination of outputs of the signal 1-1 102S1, the signal 1-2 102S2, and the signal 2 102SN is used to derive a signal representing illuminance of an image pickup surface (Step 807). After that, the derived signal is output (Step 808) for transfer to a predetermined circuit, and a series of reading operations is complete (Step 809).

A prototype device A in this invention uses a high gain amplifier for the row circuit unit 102, to thereby successfully set the noise voltage in terms of floating diffusion input to 60 µV.

The number of noise electrons in terms of input becomes 0.26 when the charge-to-voltage conversion gain is set to 230 µV/e−, to thereby read out a signal with an accuracy of one photon substantially without a problem.

Further, the number of noise electrons calculated in terms of input becomes 0.20 when the charge-to-voltage conversion gain is set to 300 µV/e−.

A relationship between the charge-to-voltage conversion gain and the floating diffusion capacitor is given by the following expression:

$$CG = q/C_{FD} \qquad (1)$$

where "CG" represents the charge-to-voltage conversion gain, "q" represents an elementary charge, and "$C_{FD}$" represents the floating diffusion capacitor.

As described above, prototyping of the prototype device A described above has used a construction flow of not forming a so-called LDD, namely, an n-type region (LDD) formed by injecting n-type impurities before forming the sidewall of a gate electrode, in order to physically reduce an overlap between the gate electrode and the n-type diffusion layer.

Further, the ion injection step of injecting n-type impurities after forming the sidewall of the gate electrode at a high dose on the order of $10^{15}$ cm$^{-2}$ is changed so that the n-type impurities are injected at a low dose of $6\times10^{14}$ cm$^{-2}$, to thereby reduce the impurity concentration of a predetermined n-type diffusion layer (n-type regions 501-1, 501-2, and 501-3).

With this, the gate overlap capacitance is further reduced, and the PN junction capacitance is also reduced. That is, in the prototype device A, the floating diffusion capacitance is 0.5 fF, the charge-to-voltage conversion gain is 320 μV/e–, and the number of noise electrons in terms of input is 0.19, to thereby enable signals to be read with an accuracy of one photon. Further, it is possible to obtain picked-up image signals linearly from one photon to 74,000 photons within one exposure period by combining the signal 1-1, the signal 1-2, and the signal 2.

Figure 13:
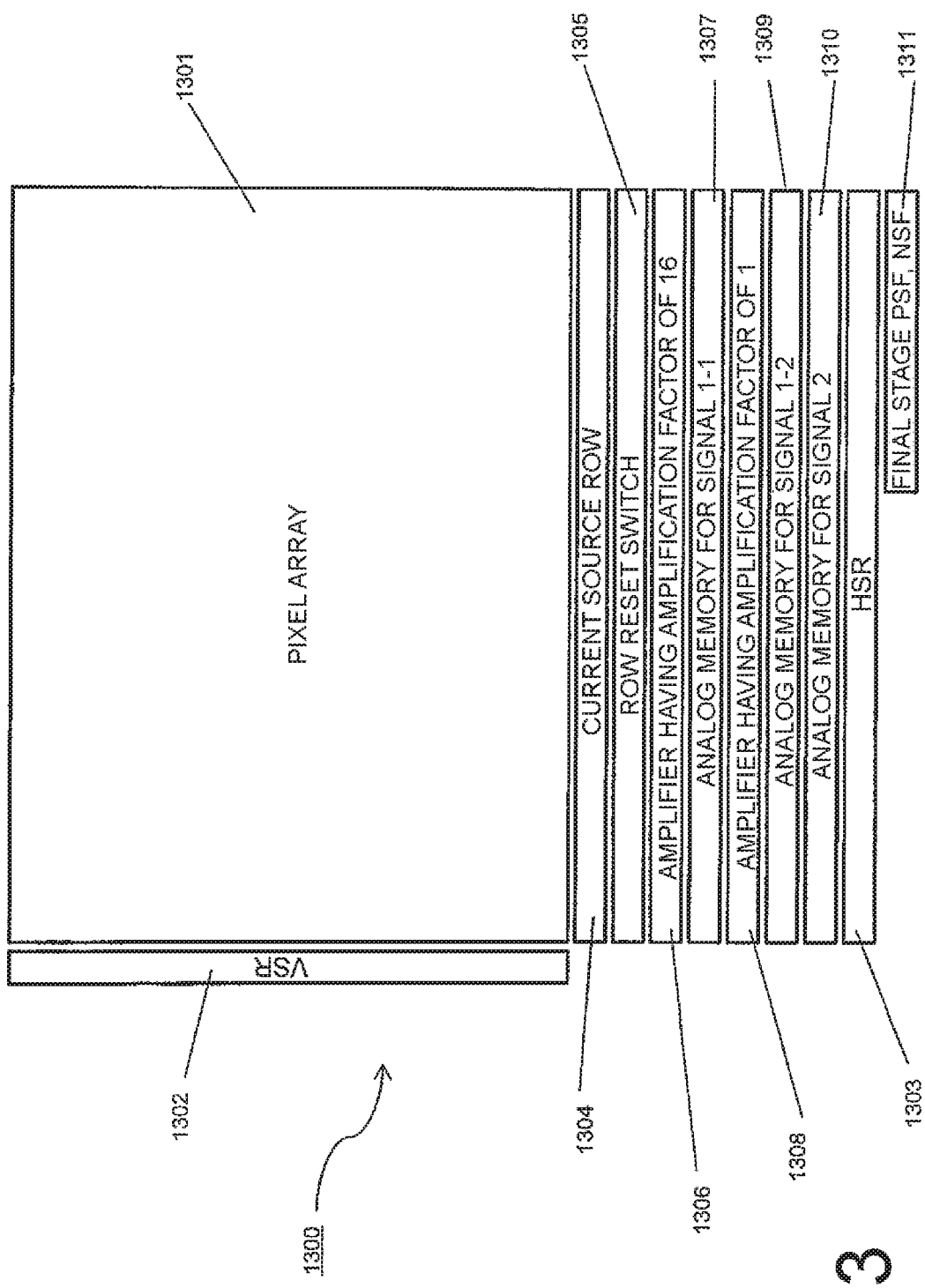
FIG. 13 is an entire block diagram for schematically illustrating the entire sensor unit of the image pickup device illustrated in FIG. 12A.

Next, a description is given of an example of a preferred embodiment of this invention when this invention is applied to an image pickup device with reference to FIG. 12A and FIG. 13. The example of FIG. 12A is the same as the example of FIG. 1 in principle. FIG. 12A is an illustration of an example of a sensor unit 1200 in a case where the CMOS image sensor in one embodiment of this invention is applied to the image pickup device in a preferred embodiment of this invention.

In FIG. 12A, a circuit diagram for representing one row of N pixel circuits and one row of readout circuits is illustrated for convenience. However, M rows of pixel circuits may be provided as required, and a readout circuit may be provided for each row of those pixel circuits accordingly. In other cases, although signal processing becomes a little slow, a readout circuit may be provided for a plurality of rows of pixel circuits. In this case, when one out of the plurality of rows of pixel circuits is being read out, transfer ON-OFF means is set to prohibit a pixel signal from being transferred between the other rows of pixel circuits and the readout circuit.

In FIG. 12A, a first row pixel circuit unit 1200-1 and a first row circuit unit 102-1 are illustrated.

N pixel (circuit) units (101-1 to 101-N) are arranged in the row pixel circuit unit 1200-1 as illustrated in the figure, and each of the pixel (circuit) units (101-1 to 101-N) is connected to a pixel row signal line 103-1 in the first row in an ascending order of rows.

In FIG. 12A, only one row pixel circuit unit is illustrated, but in actuality, M rows of pixel circuit units are arranged (1200-1 to 1200-M) (1200-2 to 1200-M are not shown).

Similarly to the case of FIG. 1, the current source 108-1 is connected downstream of the pixel row signal line 103-1.

Similarly to the case of FIG. 1, the row circuit unit 102-1 includes a first row readout circuit 102HG-1 including a high gain amplifier, a second row readout circuit 102LG-1 including a low gain amplifier, and a third row readout circuit 102N-1.

Further, similarly to the case of FIG. 1, an analog memory circuit unit (not shown) is provided in each of the row readout circuits (102HG-1, 102LG-1, and 102N-1).

A method of reading out a signal in the case of FIG. 12A is the same as that described above with reference to FIG. 1 except that the signal is read out by the number of times corresponding to N rows.

FIG. 13 is an entire block diagram for schematically illustrating the entire sensor unit of the example of the image pickup device illustrated in FIG. 12A.

A sensor unit 1300 includes "N×M" pixels each including the pixel circuit unit 101 (corresponding to one pixel) illustrated in FIG. 1, two-dimensionally arranged pixel arrays 1301, a vertical (column) shift register unit 1302, a horizontal (row) shift register unit 1303.

The sensor unit 1300 includes a current source row unit 1304, in which M current sources 108 are arranged; a reset switch row unit 1305, in which M switching means for resetting the pixel output line are arranged; an analog memory unit 1307 for the signal 1-1, in which M analog memory circuit units 106HG are arranged; an analog memory unit 1309 for the signal 1-2 in which M analog memory circuit units 106LG are arranged; and an analog memory unit 1310 for the signal 2, in which M analog memory circuit units 106N are arranged. The arrangements in those units are along the row direction of the pixel array 1301.

An amplifier unit 1306 with an amplification factor of 16 is provided between the row reset switch unit 1305 and the analog memory unit 1307 for the signal 1-1, and further, an amplifier row unit 1308 with an amplification factor of 1 is provided between the analog memory unit 1307 for the signal 1-1 and the analog memory unit 1309 for the signal 1-2.

Herein, an amplifier having an amplification factor of 16 operable as a high gain amplifier is adopted as the amplifier unit 1306 having an amplification factor of 16, and an amplifier having an amplification factor of 1 operable as a low gain amplifier is adopted as the amplifier row unit 1308 having an amplification factor of 1.

A final stage buffer 1311 is a buffer for outputting, to the outside of the chip at a low output impedance, a signal held in an analog memory of a row sequentially selected by the horizontal shift register.

Modification examples of FIG. 12A are described with reference to FIG. 12B and FIG. 12C.

Figure 12B:
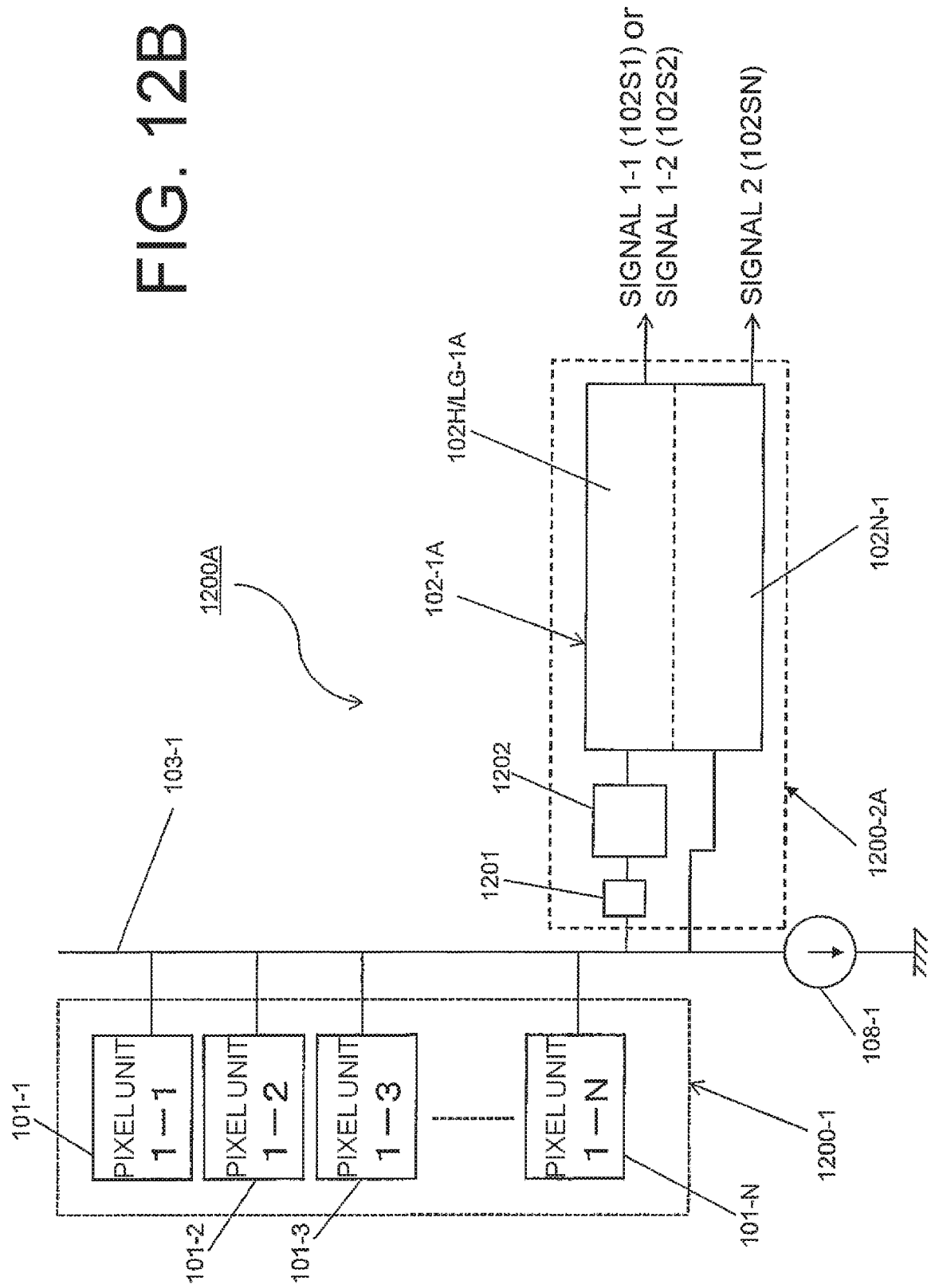
FIG. 12B is a circuit diagram for illustrating a modification example of FIG. 12A.
Figure 12C:
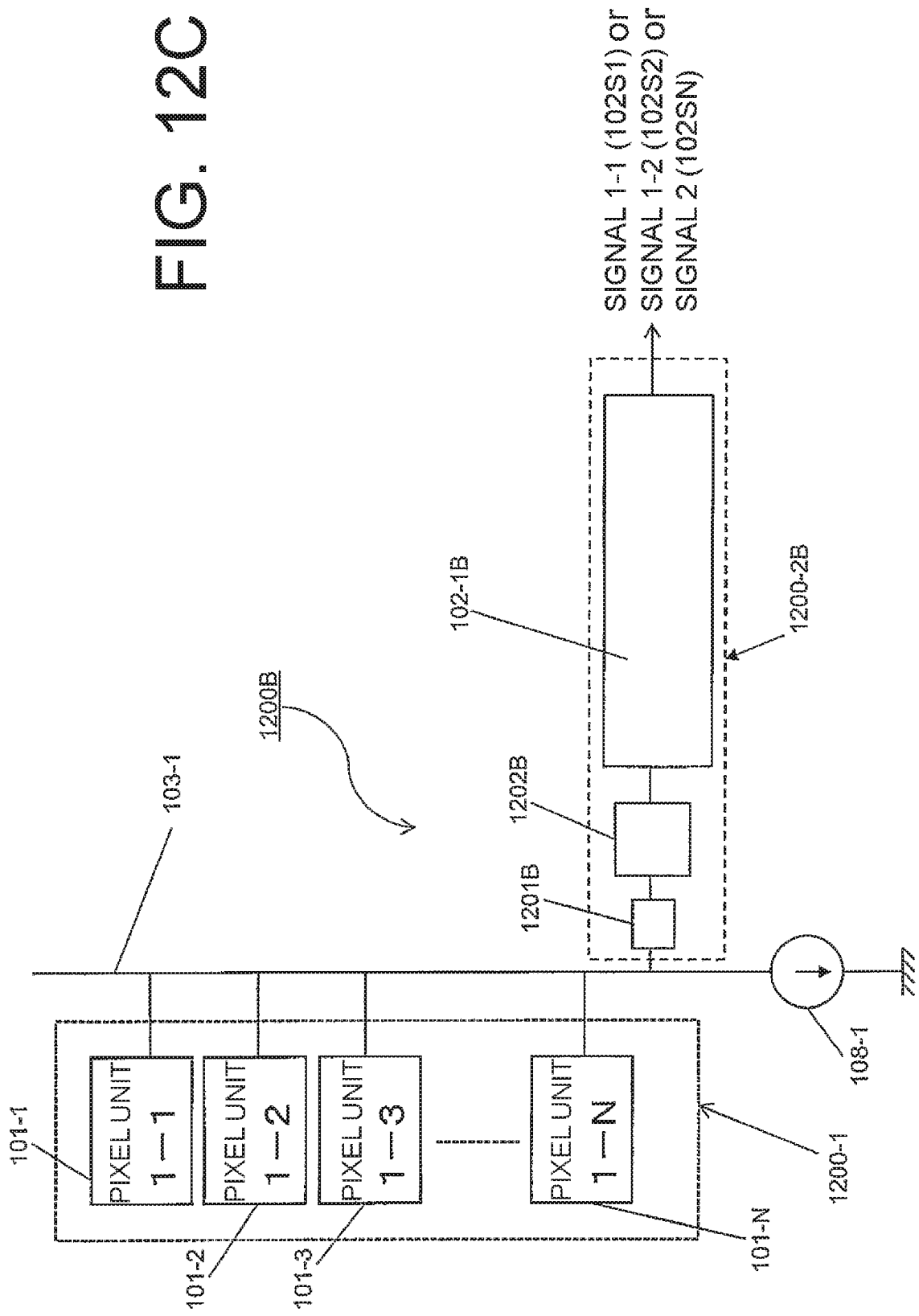
FIG. 12C is a circuit diagram for illustrating another modification example of FIG. 12A.

In FIG. 12B and FIG. 12C, means equivalent to those of FIG. 12A are denoted by the reference numerals of FIG. 12A as they are.

FIG. 12B is an illustration of a first modification example of FIG. 12A.

A sensor unit 1200A illustrated in FIG. 12B has the same configuration as that of the sensor unit 1200 illustrated in FIG. 12A except for a row circuit unit 102-1A in the first row, gain selection means 1201, and gain switching means 1202. Thus, also in the sensor unit 1200A, the same components as those of the sensor unit 1200 are denoted by the same reference numerals.

Now, a description is given of the sensor unit 1200A with a focus on differences from the sensor unit 1200.

The row circuit unit 102-1A includes a first row readout circuit unit 102H/LG-1A and a third row readout circuit unit 102N-1. The first row readout circuit unit 102H/LG-1A includes a high gain amplifier (not shown) and a low gain amplifier (not shown), and can amplify an input signal by any one of amplifiers. The first row readout circuit unit 102H/LG-1A includes an analog memory circuit unit (not shown) similarly to the case of the sensor unit 1200 of FIG. 12A. The analog memory circuit unit includes memory means for signals amplified by the high gain amplifier and memory means for signals amplified by the low gain amplifier.

When the first signal A1-1 output from the pixel unit 101-1 is transferred to the row circuit unit 102-1A via the pixel row signal line 103-1, a corresponding gain is selected by the gain selection unit 1201 and is switched to a gain selected by the gain switching unit 1202 so that the first signal A1-1 is amplified with an amplification factor of the gain selected by the readout circuit unit 102H/LG-1A.

That is, similarly to the case of FIG. 12A, when the first signal A1-1 output from the pixel unit 101-1 is a signal (ultra-high sensitive light receiving signal under ultra-low illuminance) obtained in an illumination light region of an ultra-small amount of light, the first signal A1-1 is amplified by the high gain amplifier and read out from the first row readout circuit unit 102H/LG-1 as the signal 1-1 (102S1). Meanwhile, when the first signal A1-1 output from the pixel unit 101-1 is a signal (high sensitive light receiving signal under low illuminance) obtained in an illumination light region of an amount of light that exceeds the illumination light region of an ultra-small amount of light, the first signal A1-1 is amplified by the low gain amplifier and read out from the first row readout circuit unit 102H/LG-1A as the signal 1-2 (102S2).

The second signal A1-2 is read out in the same manner as in the case of FIG. 12A.

Figure 11B:
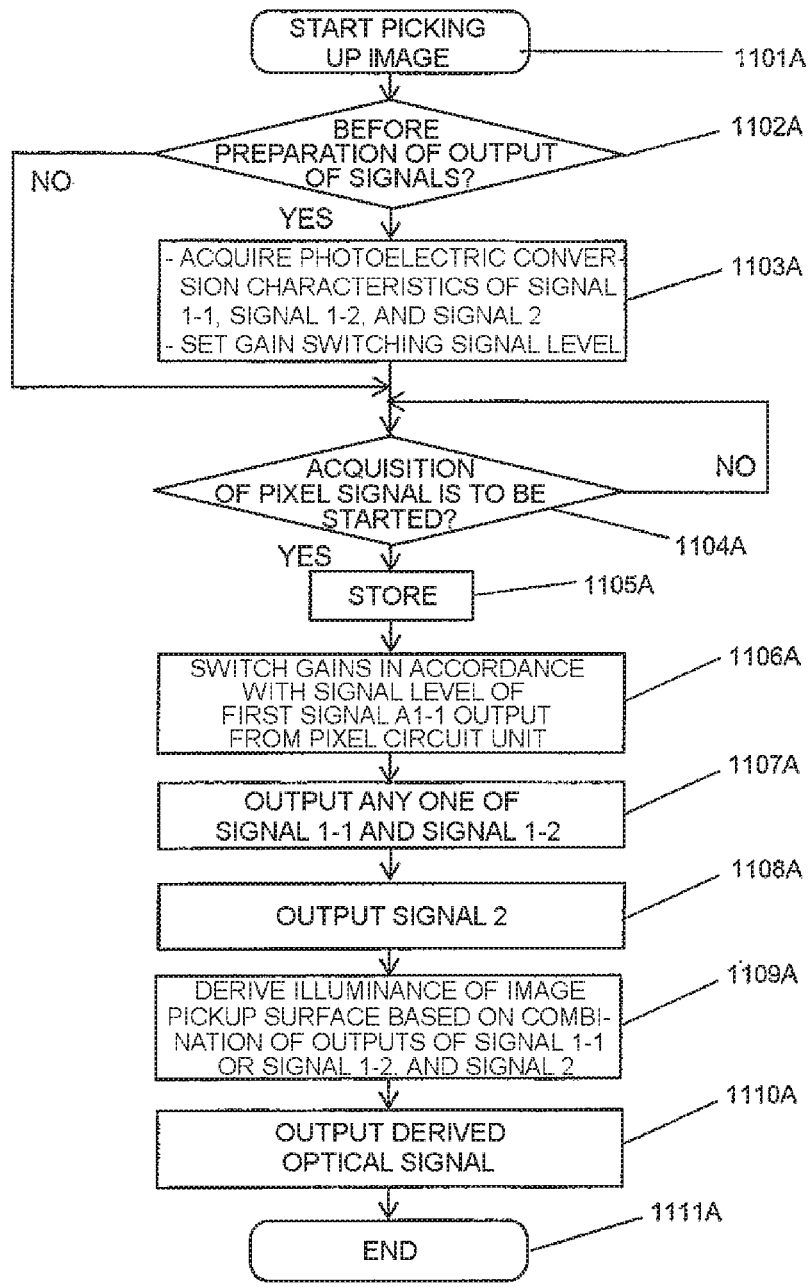
FIG. 11B is a flow chart for illustrating another procedure of reading out a signal of one pixel.

The procedure of picking up an image in the example of FIG. 12B is illustrated in FIG. 11B.

When an image is started to be picked up (Step 1101A), it is determined whether or not the current time is before preparation of output of signals (Step 1102A). When the current time is before preparation of output of signals, the processing proceeds to Step 1103A to acquire photoelectric conversion characteristics of the signal 1-1 (102S1), the signal 1-2 (102S2), and the signal 2 (102SN) and set a gain switching signal level. When acquisition of photoelectric conversion characteristics of each signal and setting of the gain switching signal level are complete, the processing proceeds to Step 1104A.

Preparation for outputting signals is that acquisition of photoelectric conversion characteristics of the signal 1-1 (102S1), the signal 1-2 (102S2), and the signal 2 (102SN) is completed and the gain switching signal level is finally set.

When preparation for outputting signals is already complete, Step 1103A is skipped, and the processing proceeds to Step 1104A.

In Step 1104A, it is determined whether or not to start acquisition of a pixel signal. When acquisition of a pixel signal ("first signal (A1-1)") is started, in Step 1105A, the acquired pixel signal is stored in predetermined capacitors (e.g., $C_{FD}$ capacitor or $C_{LOFIC}$ capacitor) of the pixel units (101-1 to 101-N).

When it is determined that acquisition of a pixel signal is not to be started, the processing returns to Step 1104A again to determine whether or not to start acquisition of a pixel signal.

When the first signal (A1-1) is stored, in Step 1106A, a corresponding gain (amplification factor) is selected by the gain selection means 1201A in accordance with a signal level of the first signal (A1-1), and is switched to the selected gain by the gain switching means 1202A. Any one of the signal 1-1 (102S1) and the signal 1-2 (102S2) is read out from a first-and-second rows reading circuit unit 102H/LG-1A in accordance with this switching of gains.

In this invention, the signal 1-1 (102S1) is treated as an ultra-high sensitive signal, and the signal 1-2 (102S2) is treated as a high sensitive signal. The ultra-high sensitive signal is amplified by the first-and-second rows reading circuit unit 102H/LG-1A by an amplification factor larger than "1".

Next, the second signal A1-2 output from the pixel unit is temporarily stored in a third row reading unit 102N-1, and, after that, is read out to the outside from a signal reading path unit 1200-2 as the signal 2 (102SN) (Step 1108A).

After that, a signal (optical signal) representing the illuminance of an image pickup surface is derived based on a combination of outputs of the read signal 1-1 (102S1), the signal 1-2 (102S2), and the signal 2 (102SN) (Step 1107A). After that, the derived optical signal is output for transfer to a predetermined circuit (Step 1110A), and a series of reading operations is finished (ended) (Step 1111A).

Figure 11C:
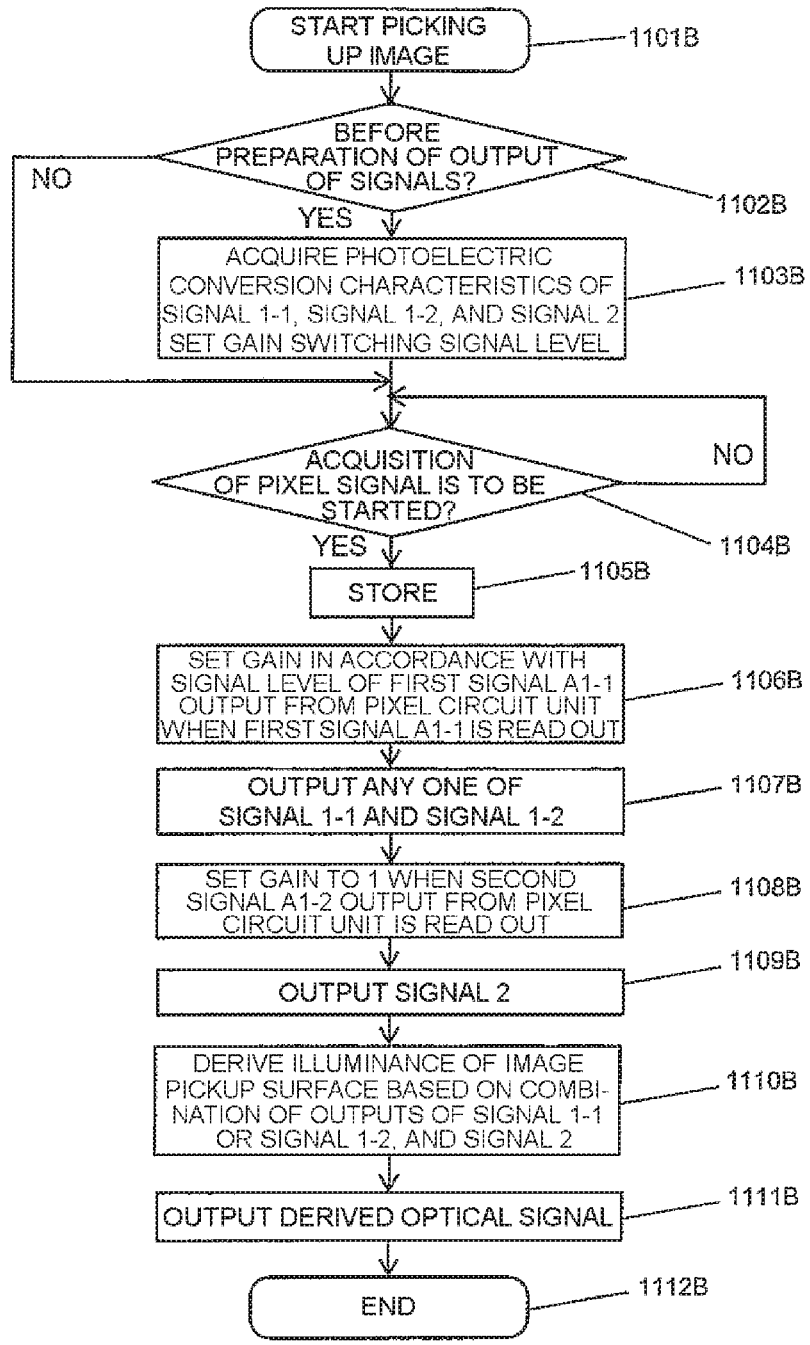
FIG. 11C is a flow chart for illustrating still another procedure of reading out a signal of one pixel.

The procedure of picking up an image in the example of FIG. 12C is illustrated in FIG. 11C.

When an image is started to be picked up (Step 1101B), it is determined whether or not the current time is before preparation of output of signals (Step 1102B). When the current time is before preparation of output of signals, the processing proceeds to Step 1103B to acquire photoelectric conversion characteristics of the signal 1-1 (102S1), the signal 1-2 (102S2), and the signal 2 (102SN) and set a gain switching signal level. When acquisition of photoelectric conversion characteristics of each signal and setting of the gain switching signal level are complete, the processing proceeds to Step 1104B.

Preparation for outputting signals is that acquisition of photoelectric conversion characteristics of the signal 1-1 (102S1), the signal 1-2 (102S2), and the signal 2 (102SN) is completed and the gain switching signal level is completely set.

When preparation for outputting signals is already complete, Step 1103B is skipped, and the processing proceeds to Step 1104B.

In Step 1104B, it is determined whether or not to start acquisition of a pixel signal. When acquisition of a pixel signal ("first signal (A1-1)") is started, in Step 1105B, the acquired pixel signal is stored in predetermined capacitors (e.g., $C_{FD}$ capacitor or $C_{LOFIC}$ capacitor) of the pixel units (101-1 to 101-N). When it is determined that acquisition of a pixel signal is not to be started, the processing returns to Step 1104B again to determine whether or not to start acquisition of a pixel signal.

When the first signal (A1-1) is stored, in Step 1106B, the gain is set in accordance with the signal level of the first signal (A1-1).

The set gain is applied to the first signal (A1-1), and any relevant one of the signal 1-1 (102S1) and the signal 1-2 (102S2) is output from the signal readout path unit 1200-1B (Step 1107B).

Next, the gain is set to "1" when the second signal (A1-2) is read out from the relevant pixel unit (Step 1108B). This set gain is applied to the second signal (A1-2) input to a reading unit 102-1B, and the signal 2 is output from the reading unit 102-1B (Step 1109B).

Next, a signal (optical signal) representing the illuminance of an image pickup surface is derived based on a combination of outputs of the read signal 1-1 (102S1), the signal 1-2 (102S2), and the signal 2 (102SN) (Step 1110B). After that, the derived optical signal is output for transfer to a predetermined circuit (Step 1111B), and a series of reading operations is finished (ended) (Step 1112B).

Also in this exemplary embodiment, the signal 1-1 (102S1) is treated as an ultra-high sensitive signal, and the signal 1-2 (102S2) is treated as a high sensitive signal. The ultra-high sensitive signal is amplified by the first-and-second rows reading circuit unit 102H/LG-1A by an amplification factor larger than "1".

Next, a description is given of FIG. 12C.

FIG. 12C is an illustration of a second modification example of FIG. 12A.

A sensor unit 1200B illustrated in FIG. 12C has the same configuration as that of the sensor unit 1200 illustrated in FIG. 12A except for a row circuit unit 102-1B in the first row, gain selection means 1201B, and gain switching means 1202B. Thus, also in the sensor unit 1200B, the same components as those of the sensor unit 1200 are denoted by the same reference numerals.

Now, a description is given of the sensor unit 1200B with a focus on differences from the sensor unit 1200.

The row circuit unit 102-1B includes a high gain amplifier (not shown) and a low gain amplifier (not shown), and can amplify an input signal by any one of those amplifiers. Further, the row circuit unit 102-1B includes a signal transfer path (not shown) that does not pass through the above-mentioned amplifiers. The signal 2 (102SN), which corresponds to the second signal A1-2 output from each pixel unit (1-1 to 1-N) via the signal transfer path, is read out from the row circuit unit 102-1B.

A gain selected by a gain selection unit 1201B in accordance with the signal level is switched by a gain switch unit 1202B to amplify the first signal A1-1 output from the pixel unit (1-1) 101-1 by the selected gain, and is read out from the row circuit unit 102-1B as the signal 1-1 (102S1) or the signal 1-2 (102S2).

Figure 14A:
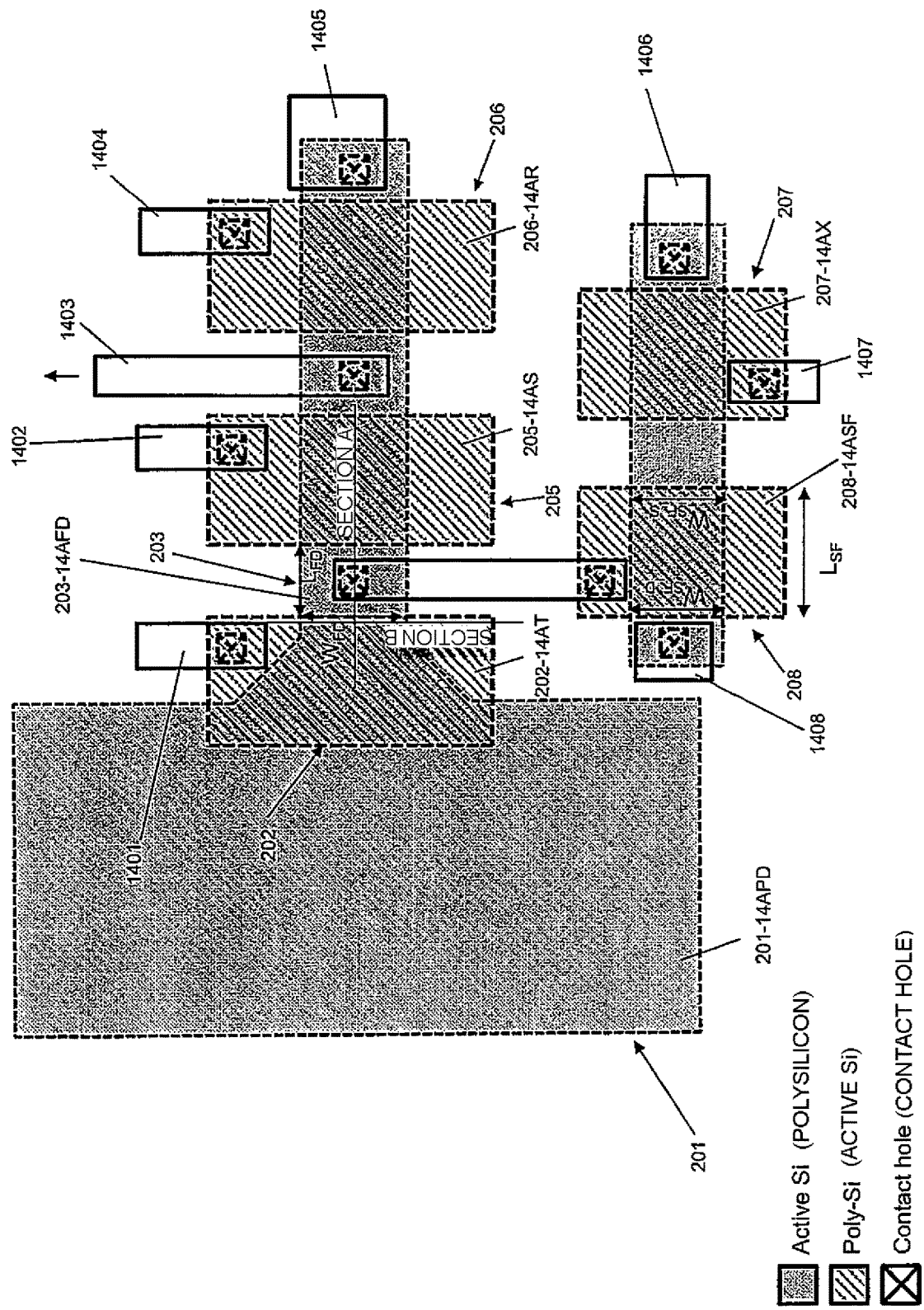
FIG. 14A is a diagram for illustrating an example of a schematic layout pattern of a pixel unit 101.
Figure 14B:
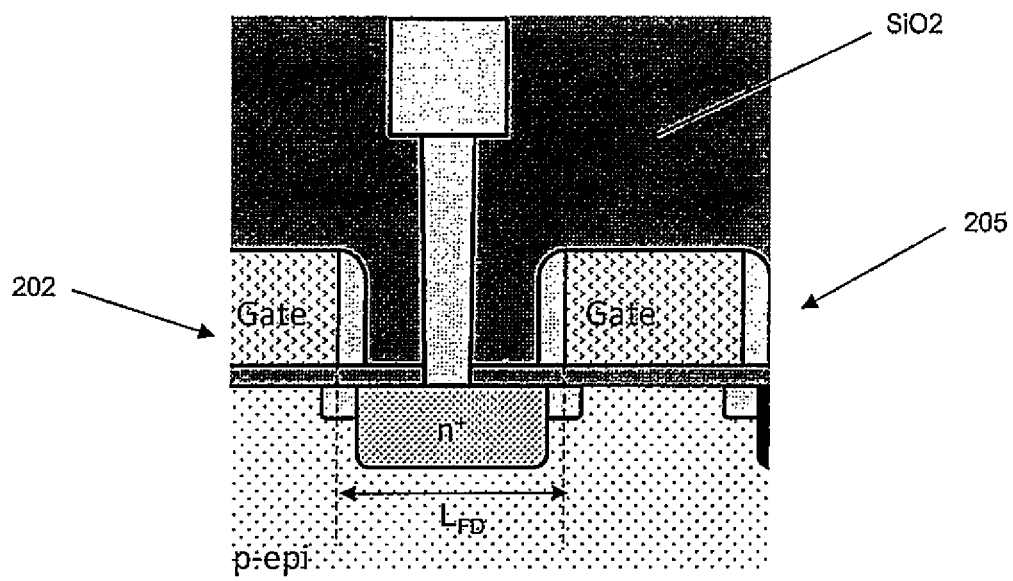
FIG. 14B is a schematic cross-sectional view taken along a cross-sectional line A of FIG. 14A.
Figure 14C:
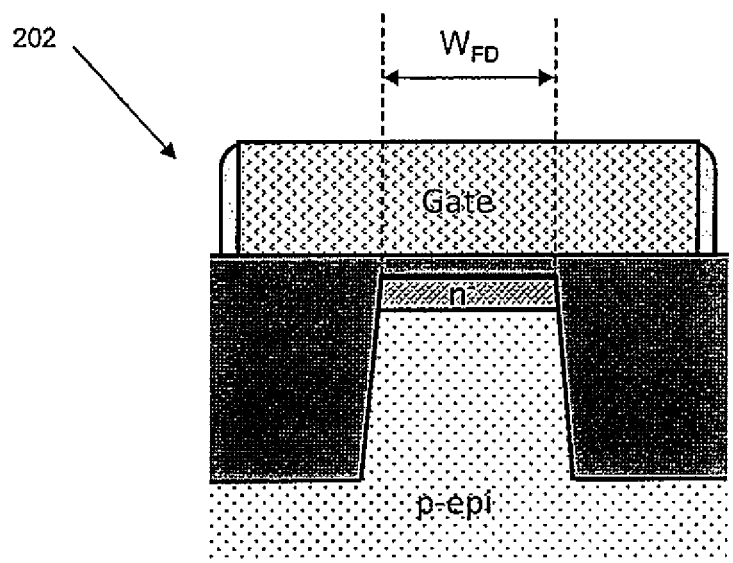
FIG. 14C is a schematic cross-sectional view taken along a cross-sectional line B of FIG. 14A.

Next, a description is given of an example of optimal design of the optical sensor unit in this invention with reference to FIG. 14A to FIG. 14C.

FIG. 14A is a diagram for illustrating a schematic top layout pattern of the device structure corresponding to the pixel circuit unit 101.

FIG. 14B is a schematic cross-sectional view taken along a cross-sectional line A of FIG. 14A. FIG. 14C is a schematic cross-sectional view taken along a cross-sectional line B of FIG. 14A.

Symbols of alphabetical letters and the like in FIG. 14A to FIG. 14C are defined as follows.

$L_{FD}$ . . . Length of floating diffusion $W_{FD}$ . . . Width of floating diffusion $L_{SF}$ . . . Length of source-follower gate $W_{SF\_D}$ . . . Width on drain side of source-follower gate $W_{SF\_S}$ . . . Width on source side of source-follower gate In FIG. 14A, a schematic layout pattern of the device structure of the pixel circuit unit 101 including the equivalent circuit of FIG. 2 is illustrated.

In FIG. 14A, components equivalent to those of FIG. 2 are denoted by the same reference numerals as those of FIG. 2.

That is, the device of the pixel circuit unit 101 includes the photodiode 201 (PD), the switching means for transfer 202 (T), the floating diffusion capacitor 203 (FD), the switching means 205 (S) for overflow, the switching means 206 (R) for resetting, the pixel selection switching means 207 (X), and the source-follower switching means 208 (SF).

In FIG. 14A, further, the following components of the device of the pixel circuit unit 101 are denoted by reference numerals.

Light receiving surface region 201-14APD of photodiode 201

Gate electrode region 202-14AT of switching means 202 for transfer

FD region 203-14AFD of floating diffusion capacitor 203

Gate electrode region 205-14AS of switching means 205 for overflow

Gate electrode region 206-14AR of switching means 206 for resetting

Gate electrode region 207-14AX of pixel selection switching means 207

Gate electrode region 208-14ASF of source-follower switching means 208

Electrode region 1401 for applying transfer signal ΦT

Electrode region 1402 for applying switch signal ΦS

Electrode region 1403 for transferring charge signal to lateral overflow integration capacitor 204 ($C_{LOFIC}$)

Electrode region 1404 for applying reset signal ΦR

Electrode region 1405 for applying reset voltage $V_R$

Electrode region 1406 for outputting pixel signal

Electrode region 1407 for applying pixel selection switch signal ΦX

Electrode region 1408 for applying power supply voltage AVDD

An overlap capacitance between the switching means 202 for transfer and the FD region 203-14AFD of the floating diffusion capacitor 203 and an overlap capacitance between the switching means 205 for overflow and the FD region 203-14AFD of the floating diffusion capacitor 203, which serve as constituent factors of the floating diffusion capacitor 203, are proportional to the floating diffusion width ($W_{FD}$). Further, the PN junction capacitance formed by the n$^+$ diffusion layer and the p-type region, which are components of the floating diffusion capacitor 203, serves as a constituent factor of the floating diffusion capacitor 203 and is proportional to "WFD" and "LFD".

From the description given above, "$W_{FD}$" and "$L_{FD}$" are desired to be reduced in order to reduce the capacitance value of the floating diffusion capacitor 203 to improve the conversion gain.

Next, the following description is given of a result of prototyping and characteristic measurement of the device in this invention.

Pixels for which the values of "$W_{FD}$" and "$L_{FD}$" were changed were repeatedly designed and prototyped to measure the floating diffusion capacitance obtained when the values of "$W_{FD}$" and "$L_{FD}$" were changed in various manners.

At this time, the values of "$W_{SF\_D}$", "$W_{SF\_S}$", and "$L_{SF}$" were set to 0.30 µm, 0.30 µm, and 0.50 µm, respectively, and the gain of prototyped "SF" was set to 0.92.

Figure 15:
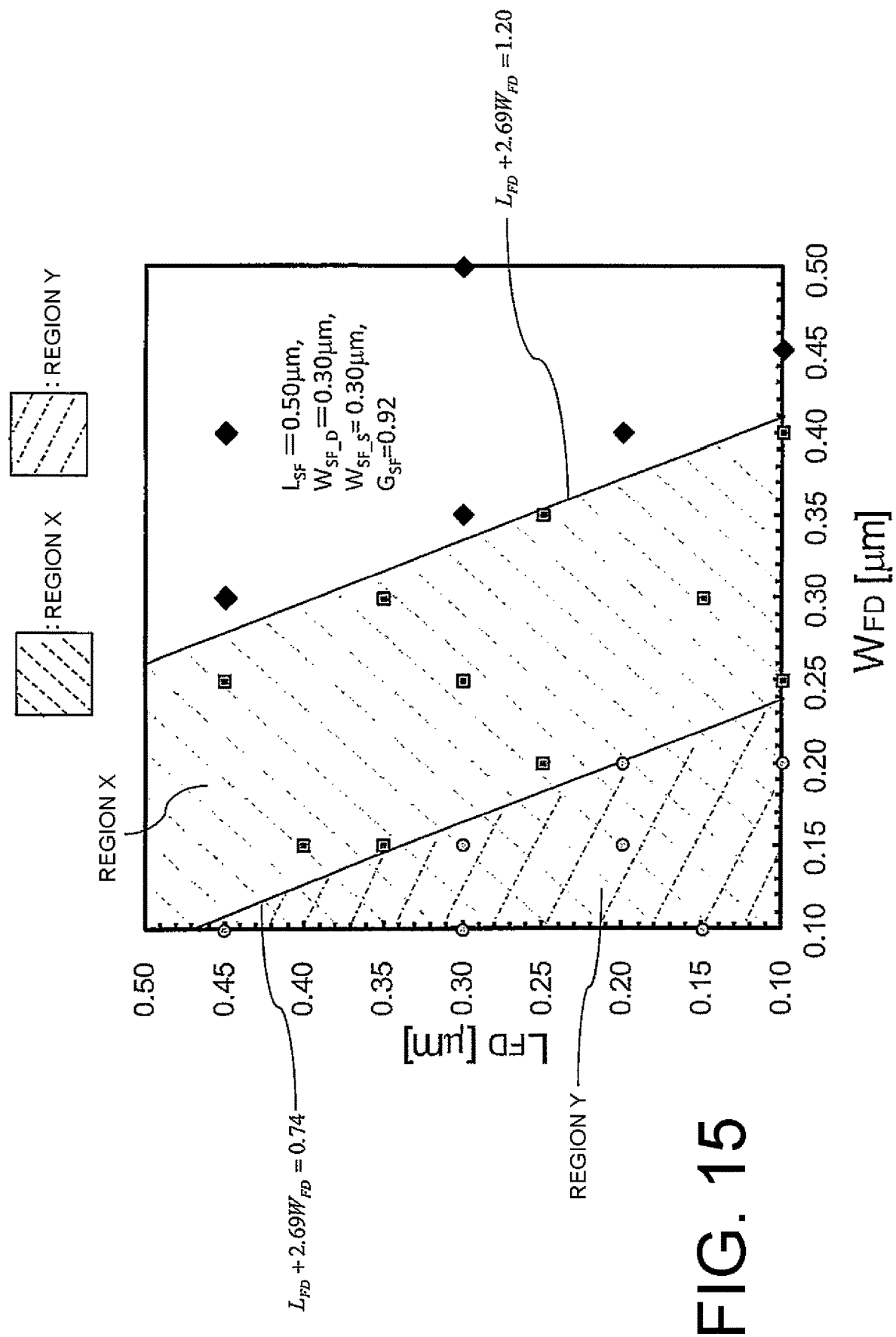
FIG. 15 is a graph for showing experiment results.

As a result of measuring the floating diffusion capacitance of the prototyped pixel, characteristics shown in Table 1 and FIG. 15 were obtained.

It has been found that, on the basis of the tendency illustrated in FIG. 15, in order to obtain $C_{FD}$ equal to or smaller than 0.69 fF, that is, in order to cause the conversion gain to be equal to or larger than 230 μV/e– to obtain a suitable result, it is only required that "$W_{FD}$" and "$L_{FD}$" satisfy the following conditional expression 1.

$$L_{FD}+2.69 \cdot W_{FD} \leq 1.20 \quad \text{(Conditional Expression 1)}$$

Further, It has been found that, in order to obtain $C_{FD}$ equal to or smaller than 0.53 fF, that is, in order to cause the conversion gain to be equal to or larger than 300 mV/e– to obtain a more suitable result, it is only required that "$W_{FD}$" and "$L_{FD}$" satisfy the following conditional expression 2.

$$L_{FD}+2.69 \cdot W_{FD} \leq 0.74 \quad \text{(Conditional Expression 2)}$$

Although the units of "$W_{FD}$" and "$L_{FD}$" are in micrometers (μm), absolute numbers of "$W_{FD}$" and "$L_{FD}$" are used in the conditional expressions 1 and 2.

In FIG. 15, "□" indicates a suitable sample, "○" indicates a more suitable sample, and "◆+" indicates a sample for comparison.

In FIG. 15, a region X indicates a region in which a suitable sample is obtained, and a region Y indicates a region in which a more suitable sample is obtained.

TABLE 1

| $W_{FD}$ [μm] | $L_{FD}$ [μm] | $C_{FD}$ [fF] | Classification |      |
|---|---|---|---|---|
| 0.10 | 0.15 | 0.42 | Suitable | More Suitable |
| 0.10 | 0.30 | 0.47 | | |
| 0.10 | 0.45 | 0.52 | | |
| 0.15 | 0.20 | 0.48 | | |
| 0.15 | 0.30 | 0.52 | | |
| 0.20 | 0.10 | 0.50 | | |
| 0.20 | 0.20 | 0.53 | | |
| 0.15 | 0.35 | 0.54 | | |
| 0.15 | 0.40 | 0.55 | | |
| 0.20 | 0.25 | 0.55 | | |
| 0.25 | 0.10 | 0.54 | | |
| 0.25 | 0.30 | 0.61 | | |
| 0.25 | 0.45 | 0.66 | | |
| 0.30 | 0.35 | 0.68 | | |
| 0.35 | 0.25 | 0.69 | | |
| 0.30 | 0.45 | 0.71 | Not Suitable | |
| 0.35 | 0.30 | 0.71 | | |
| 0.40 | 0.20 | 0.72 | | |
| 0.40 | 0.45 | 0.80 | | |
| 0.45 | 0.10 | 0.73 | | |
| 0.50 | 0.30 | 0.85 | | |

REFERENCE SIGNS LIST

100 . . . optical sensor unit
101, 101-1 to 101-N . . . pixel unit
102, 102-1, 102-1A, 102-1B . . . readout unit
102HG, 102HG-1 . . . first row readout unit
102LG, 102LG-1 . . . second row readout unit
102N, 102N-1 . . . third row readout unit
102H/LG-1A . . . first-and-second rows reading circuit unit
102S1 . . . read signal 1-1
102S2 . . . read signal 1-2
102SN . . . signal 2
103, 103-1 . . . pixel row signal line
104HG . . . switching means (SW/AMPEN)
104LG . . . switching means (SW/AMPEN)
105HG . . . high gain amplifier
105LG . . . low gain amplifier
106HG . . . analog memory circuit unit
106LG . . . analog memory circuit unit
106N . . . analog memory circuit unit
106HG-1 . . . switching means (NS1H)
106LG-1 . . . switching means (NS1)
106N-1 . . . switching means (NS2)
106HG-2 . . . capacitor (N1H)
106LG-2 . . . capacitor (N1)
106N-2 . . . capacitor (N2)
106HG-3 . . . switching means (SS1H)
106LG-3 . . . switching means (SS1)
106N-3 . . . switching means (SS2)
106HG-4 . . . capacitor (S1H)
106LG-4 . . . capacitor (S1)
106N-4 . . . capacitor (S2)
107HG . . . signal line for signal 1-1
107LG . . . signal line for signal 1-2
107N1 . . . signal line for signal 2 branched from pixel row output signal line
108, 108-1 . . . current source
200-1 to 200-3 . . . (gate) overlap capacitor
201 . . . photodiode (PD)
202 . . . switching means for transfer (T)
202-1 . . . electrode of switching means for transfer (T)
203 . . . capacitance of floating diffusion capacitor ($C_{FD}$)
204 . . . lateral overflow integration capacitor ($C_{LOFIC}$)
204-1 . . . electrode of lateral overflow integration capacitor ($C_{LOFIC}$)
205 . . . switching means for overflow (S)
205-1 . . . electrode of switching means(S) for overflow
206 . . . switching means (R) for resetting
206-1 . . . electrode of switching means(R) for resetting
207 . . . pixel selection switching means (X)
207-1 . . . electrode of pixel selection switching means (X)
208 . . . source-follower switching means switching means (SF)
208-1 . . . electrode of source-follower switching means (SF)
300 . . . p-epi layer
301A1, 301A2, 301B1, 301B2 . . . MOS transistor
302 . . . diffusion layer ($n^+$ . . . layer)
303A, 303B . . . gate electrode
304A, 304B1, 304B2 . . . side wall
305 . . . LDD
306 . . . insulating film layer
400 . . . p-epi layer
401A1, 401A2 . . . MOS transistor
402A . . . diffusion layer ($n^+$ . . . layer)
403A, 403B . . . gate electrode
404A, 404*b*1, 403*b*2 . . . side wall
500 . . . optical input sensor unit
500-1 . . . n-type silicon (n-Si) substrate
500-2 . . . p-type silicon layer
501-2 to 501-3 . . . n-type region obtained by reducing amount of impurities
502-1 to 502-5 . . . $n^+$-type region
503-1 to 503-6 . . . LDD
504 . . . FD diffusion layer unit
505 . . . pixel SF unit
506-1 to 506-4 . . . device separation regions
507-1 to 507-3 . . . p-type embedded region
508 . . . $n^-$ region
509 . . . $p^+$ . . . region
510 . . . $p^+$-type region near STI
511, 512 . . . n-type region
601-1 to 601-3 . . . photoresist for forming LDD
602-1 to 602-11 . . . side wall 603-1 to 603-2 . . . photoresist for forming S/D diffusion layer
604-1 to 604-3 . . . photoresist for forming S/D high-concentration diffusion layer
605-1 to 605-2 . . . wiring-interlayer insulation layers
606-1 to 606-3 . . . contact electrodes
607-1 to 607-2 . . . metal wiring
608-1 to 608-4 . . . LDD
609-1, 609-2 . . . diffusion layer
1200, 1200A, 1200B . . . optical sensor unit
1200-1 . . . pixel circuit unit row
1200-2, 1200-2A, 1200-2B . . . signal reading path unit
1201, 1201B . . . gain selection means
1202, 1202B . . . gain switching means
1300 . . . optical sensor unit
1301 . . . pixel array
1302 . . . vertical shift register unit
1303 . . . horizontal shift register unit
1304 . . . current source row unit
1305 . . . pixel output line reset switch unit
1306 . . . amplifier having amplification factor of 16
1307 . . . analog memory for signal 1-1
1308 . . . amplifier with amplification factor of 1
1309 . . . analog memory for signal 1-2
1310 . . . analog memory for signal 2
1311 . . . final stage buffer
201-14APD . . . light receiving surface region of photodiode 201
202-14AT . . . gate electrode region of switching means 202 for transfer
203-14AFD . . . FD region of floating diffusion capacitor 203
205-14AS . . . gate electrode region of switching means 205 for overflow
206-14AR . . . gate electrode region of switching means 206 for resetting
207-14AX . . . gate electrode region of pixel selection switching means 207
208-14ASF . . . gate electrode region of source-follower switching means 208
1401 . . . electrode region for applying transfer signal ΦT
1402 . . . electrode region for applying switch signal ΦS
1403 . . . electrode region for transferring charge signal to lateral overflow integration capacitor 204 ($C_{LOFIC}$)
1404 . . . electrode region for applying reset signal ΦR
1405 . . . electrode region for applying reset voltage $V_R$
1406 . . . electrode region for outputting pixel signal
1407 . . . electrode region for applying pixel selection switch signal ΦX
1408 . . . electrode region for applying power supply voltage AVDD

The invention claimed is:

1. An optical sensor, comprising:
a light receiving element;
a storage capacitor configured to store a charge;
a transfer switch configured to transfer, to the storage capacitor, a charge generated by light input to the light receiving element; and
a pixel signal output line,
wherein the pixel signal output line has a signal readout path connected thereto,
wherein the storage capacitor includes a floating diffusion capacitor ($C_{FD}$) and a lateral overflow integration capacitor ($C_{LOFIC}$),
wherein the transfer switch includes an LDD-MOS transistor,
wherein a concentration ($N_D$) of semiconductor impurities in a drain region of the LDD-MOS transistor and a concentration (N) of semiconductor impurities in a diffusion region provided adjacent to the drain region satisfy the following relationships:

$$1 < N/N_D \leq 100 \quad (1); \text{ and}$$

$$0 < N \leq 1.0 \times 10^{20} \text{ cm}^{-3} \quad (2),$$

wherein a first pixel output signal subjected to charge-to-voltage conversion by the floating diffusion capacitor ($C_{FD}$) and a second pixel output signal subjected to charge-to-voltage conversion by a combination of the floating diffusion capacitor ($C_{FD}$) and the lateral overflow integration capacitor ($C_{LOFIC}$) are input to the signal readout path, and
wherein the first pixel output signal is amplified by an amplification factor larger than 1 when the first pixel output signal is an ultra-high sensitive signal.

2. A multi-pixel optical sensor, comprising:
a row of plurality of two-dimensionally arranged pixel units, each including:
a light receiving element;
a storage capacitor configured to store a charge; and
a transfer switch configured to transfer, to the storage capacitor, a charge generated by light input to the light receiving element,
the storage capacitor including a floating diffusion capacitor ($C_{FD}$) and a lateral overflow integration capacitor ($C_{LOFIC}$),
the transfer switch including an LDD-MOS transistor,
a concentration ($N_D$) of semiconductor impurities in a drain region of the LDD-MOS transistor and a concentration (N) of semiconductor impurities in a diffusion region provided adjacent to the drain region satisfying the following relationships:

$$1 < N/N_D \leq 100 \quad (1); \text{ and}$$

$$0 < N \leq 1.0 \times 10^{20} \text{ cm}^{-3} \quad (2),$$

a pixel signal output line, to which each of the plurality of two-dimensionally arranged pixel units is sequentially connected; and
a signal readout path unit configured to execute amplification by using an amplification factor larger than 1 and another amplification factor different from the amplification factor in a different manner, the signal readout path unit being connected to the pixel signal output line at a position downstream of a position at which a last pixel unit in the row of plurality of two-dimensionally arranged pixel units is connected to the pixel signal output line,
wherein a first pixel output signal subjected to charge-to-voltage conversion by the floating diffusion capacitor ($C_{FD}$) and a second pixel output signal subjected to charge-to-voltage conversion by a combination of the floating diffusion capacitor ($C_{FD}$) and the lateral overflow integration capacitor ($C_{LOFIC}$) are input to the signal readout path.

3. A signal readout method to be executed by an optical sensor, the optical sensor including, for each pixel unit:
a light receiving element;
a storage capacitor configured to store a charge; and
a transfer switch configured to transfer, to the storage capacitor, a charge generated by light input to the light receiving element, the storage capacitor including a floating diffusion capacitor and a lateral overflow integration capacitor, the transfer switch including an LDD-MOS transistor, a concentration ($N_D$) of semiconductor impurities in a drain region of the LDD-MOS transistor and a concentration (N) of semiconductor impurities in a diffusion region provided adjacent to the drain region satisfying the following relationships:

$$1 < N/N_D \le 100 \qquad (1); \text{ and}$$

$$0 < N \le 1.0 \times 10^{20} \text{ cm}^{-3} \qquad (2),$$

the optical sensor further including:
  a pixel signal output line, to which each pixel unit is connected; and
  a signal readout path connected to the pixel signal output line,
the signal readout method comprising:
subjecting, by the floating diffusion capacitor, an amount of charges that contribute to readout to charge-to-voltage conversion so as to form a first pixel output signal;
subjecting, by a combination of the floating diffusion capacitor and the lateral overflow integration capacitor, the amount of charges that contribute to readout to charge-to-voltage conversion so as to form a second pixel output signal;
inputting the first pixel output signal and the second pixel output signal to the signal readout path; and
amplifying the first pixel output signal in the signal readout path by a plurality of amplifiers including at least one amplifier having an amplification factor larger than 1.

4. An image pickup device, comprising:
a plurality of pixel units each including:
  a light receiving element (PD);
  a switch for transfer (T);
  a switch for overflow (S);
  a switch for resetting (R);
  the light receiving element (PD), the switch for transfer (T), the switch for overflow (S), and the switch for resetting (R) are connected in series in the stated order,
  a floating diffusion capacitor ($C_{FD}$) and a source-follower switch (SF), which are connected to a line between the switch for transfer (T) and the switch for overflow (5); and
  a lateral overflow integration capacitor ($C_{LOFIC}$), which is connected to a line between the switch for overflow (S) and the switch for resetting (R),
  the source-follower switch (SF) including a MOS transistor,
  a concentration ($N_D$) of semiconductor impurities in a drain region in the switch for transfer (T) and a concentration (N) of semiconductor impurities in a diffusion region provided adjacent to the drain region satisfying the following relationships:

$$1 < N/N_D \le 100 \qquad (1); \text{ and}$$

$$0 < N \le 1.0 \times 10^{20} \text{ cm}^{-3} \qquad (2),$$

the light receiving elements (PD) of the plurality of pixel units forming an array of two-dimensionally arranged pixels;
a pixel row output signal line, to which the plurality of pixel units are sequentially connected; and
a reading unit connected to the pixel row output signal line,
wherein a first pixel output signal subjected to charge-to-voltage conversion by the floating diffusion capacitor ($C_{FD}$) and a second pixel output signal subjected to charge-to-voltage conversion by a combination of the floating diffusion capacitor ($C_{FD}$) and the lateral overflow integration capacitor ($C_{LOFIC}$) are input to the reading unit, and
wherein the first pixel output signal is amplified in a signal readout path by a plurality of amplifiers including at least one amplifier having an amplification factor larger than 1.

5. A signal readout method for an image pickup device, the signal readout method comprising:
preparing an image pickup device including:
  a plurality of pixel units each including:
    a light receiving element (PD);
    a switch for transfer (T);
    a switch for overflow (S);
    a switch for resetting (R);
    the light receiving element (PD), the switch for transfer (T), the switch for overflow (S), and the switch for resetting (R) are connected in series in the stated order,
    a floating diffusion capacitor ($C_{FD}$) and a source-follower switch (SF), which are connected to a line between the switch for transfer (T) and the switch for overflow (S); and
    a lateral overflow integration capacitor ($C_{LOFIC}$), which is connected to a line between the switch for overflow (S) and the switch for resetting (R),
  the source-follower switch (SF) including a MOS transistor,
  a concentration ($N_D$) of semiconductor impurities in a drain region in the switch for transfer (T) and a concentration (N) of semiconductor impurities in a diffusion region provided adjacent to the drain region satisfying the following relationships:

$$1 < N/N_D \le 100 \qquad (1); \text{ and}$$

$$0 < N \le 1.0 \times 10^{20} \text{ cm}^{-3} \qquad (2),$$

the light receiving elements (PD) of the plurality of pixel units forming an array of two-dimensionally arranged pixels;
a pixel row output signal line, to which the plurality of pixel units are sequentially connected; and
a reading unit connected to the pixel row output signal line;
subjecting, by the floating diffusion capacitor ($C_{FD}$), an amount of charges that contribute to readout to charge-to-voltage conversion so as to form a first pixel output signal;
subjecting, by a combination of the floating diffusion capacitor ($C_{FD}$) and the lateral overflow integration capacitor ($C_{LOFIC}$), the amount of charges that contribute to readout to charge-to-voltage conversion so as to form a second pixel output signal;
inputting the first pixel output signal and the second pixel output signal to a signal readout path; and amplifying the first pixel output signal in the signal readout path by a plurality of amplifiers including at least one amplifier having an amplification factor larger than 1.

6. An optical sensor, comprising:
(1) a pixel unit having a photoelectric conversion function,
the pixel unit including:
a storage capacitor configured to store a charge subjected to photoelectric conversion; and
a transfer switch configured to transfer the charge to the storage capacitor;
the storage capacitor including a floating diffusion capacitor ($C_{FD}$) and a lateral overflow integration capacitor ($C_{LOFIC}$),
the transfer switch including an LDD-MOS transistor,
a concentration ($N_D$) of semiconductor impurities in a drain region of the LDD-MOS transistor and a concentration (N) of semiconductor impurities in a diffusion region provided adjacent to the drain region satisfying the following relationships:

$$1 < N/N_D \leq 100 \quad (1); \text{ and}$$

$$0 < N \leq 1.0 \times 10^{20} \text{ cm}^{-3} \quad (2),$$

(2) a pixel signal output line connected to the pixel unit; and
(3) a signal readout path connected to the pixel signal output line,
wherein a first pixel output signal subjected to charge-to-voltage conversion by the floating diffusion capacitor ($C_{FD}$) and a second pixel output signal subjected to charge-to-voltage conversion by a combination of the floating diffusion capacitor ($C_{FD}$) and the lateral overflow integration capacitor ($C_{LOFIC}$) are input to the signal readout path, and
wherein the first pixel output signal is amplified by an amplification factor larger than 1 when the first pixel output signal is an ultra-high sensitive signal.

* * * * *